(12) United States Patent
McKee

(10) Patent No.: US 6,330,181 B1
(45) Date of Patent: Dec. 11, 2001

(54) METHOD OF FORMING A GATE DEVICE WITH RAISED CHANNEL

(75) Inventor: Jeffrey A. McKee, Grapevine, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/405,737

(22) Filed: Sep. 24, 1999

Related U.S. Application Data

(60) Provisional application No. 60/102,359, filed on Sep. 29, 1998.

(51) Int. Cl.[7] ................................................ G11C 11/24
(52) U.S. Cl. ............................ 365/149; 365/102; 365/174
(58) Field of Search .......................... 365/218, 149, 365/185, 182, 184, 189, 102, 174; 257/329, 332, 334, 296, 297; 438/260

(56) References Cited

U.S. PATENT DOCUMENTS

| | | | |
|---|---|---|---|
| 5,166,904 | * 11/1992 | Hazani | 365/218 |
| 5,278,438 | 1/1994 | Kim et al. | 257/316 |
| 5,341,326 | * 8/1994 | Takase et al. | 365/149 |
| 5,404,038 | * 4/1995 | Morihara | 257/329 |
| 5,525,820 | * 6/1996 | Furuyama | 257/296 |
| 5,684,316 | 11/1997 | Lee | 257/306 |
| 5,959,322 | 9/1999 | Lee | 257/298 |
| 5,972,758 | 10/1999 | Liang | 438/294 |
| 6,110,798 | 8/2000 | Gonzalez et al. | 438/426 |
| 6,136,652 | * 10/2000 | Hazani | 438/260 |

FOREIGN PATENT DOCUMENTS

| | | | |
|---|---|---|---|
| 411008379 | 1/1999 | (JP) . | |
| 06291279 | * 12/1999 | (JP) | 27/108 |
| 11340430 | * 12/1999 | (JP) | 27/108 |

\* cited by examiner

*Primary Examiner*—Charles Bowers
*Assistant Examiner*—Laura M Schillinger
(74) *Attorney, Agent, or Firm*—W. James Brady, III; Frederick J. Telecky, Jr.

(57) ABSTRACT

A method for fabricating a gate device includes forming an elongated projection (422) on a substrate (412). The elongated projection (422) protrudes from a surrounding area (424) of the substrate (412) and includes an access channel (434) for the gate device. A first terminal (430) and a second terminal (432) are formed and coupled to the access channel (434) in the elongated projection. A gate structure (522) is formed and operable to control the access channel (434) to selectively couple the first terminal (430) to the second terminal (432).

16 Claims, 29 Drawing Sheets

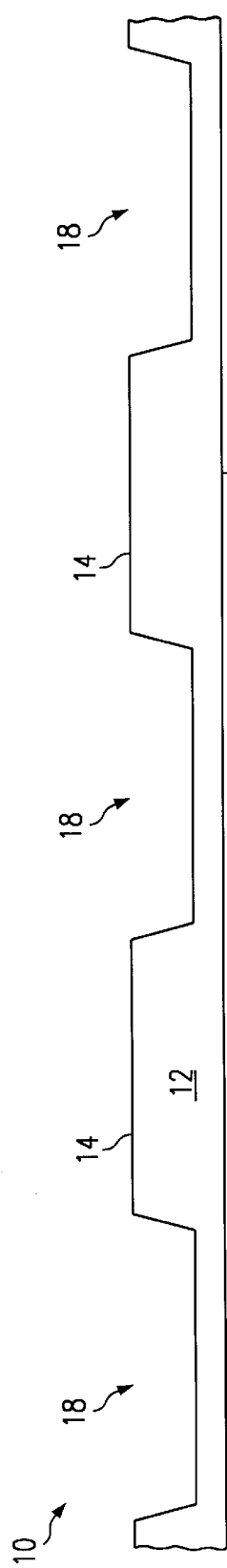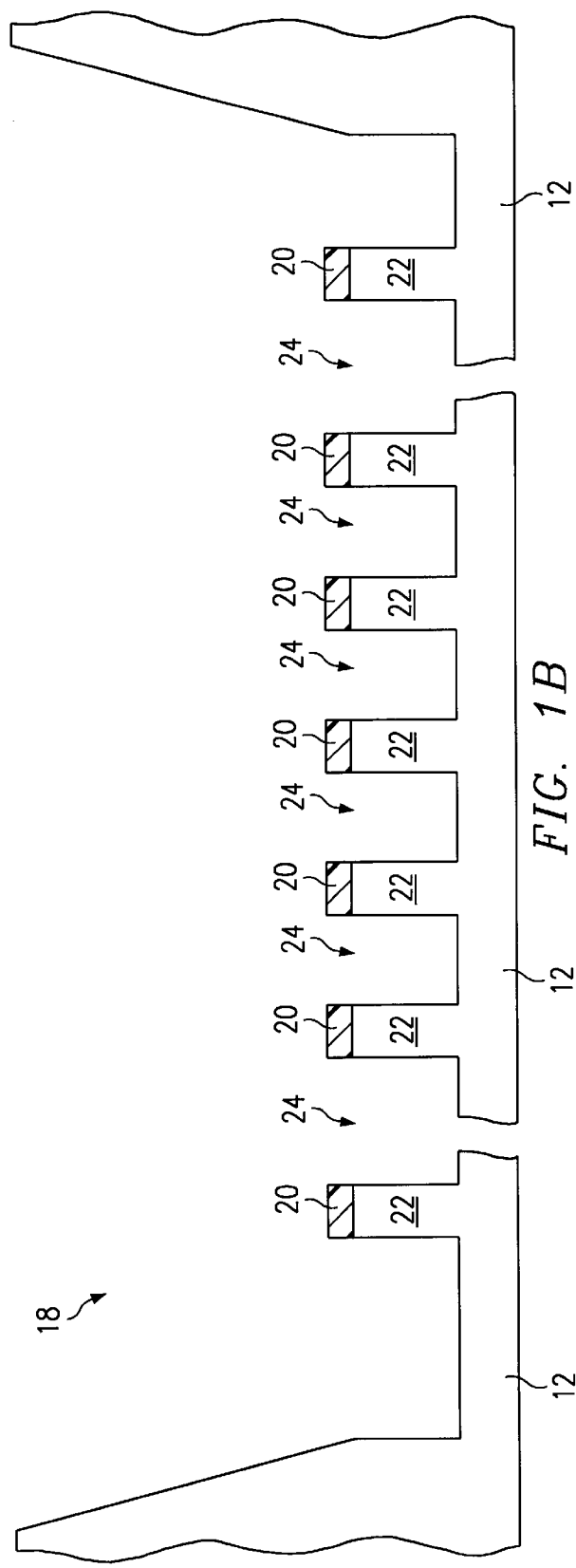

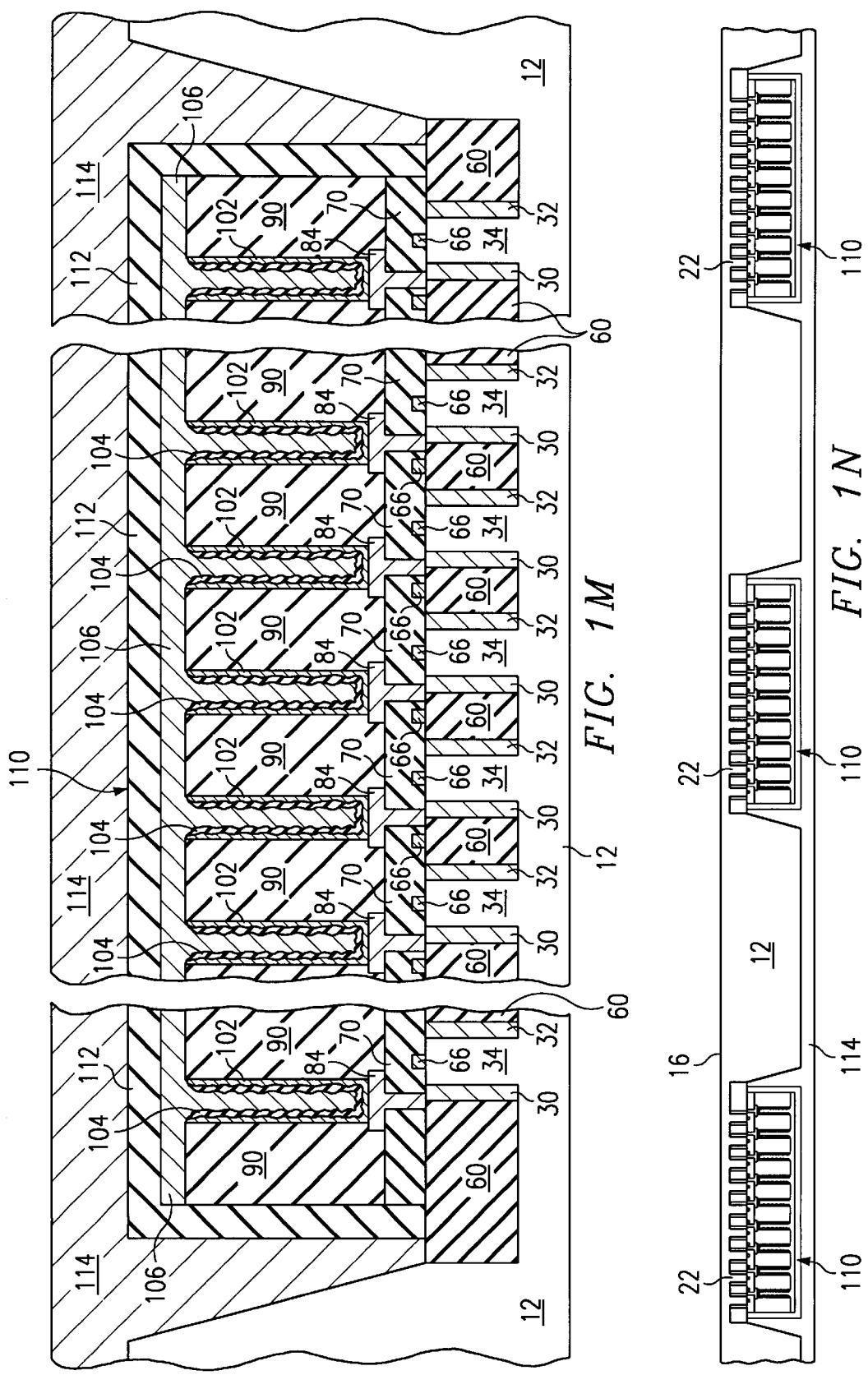

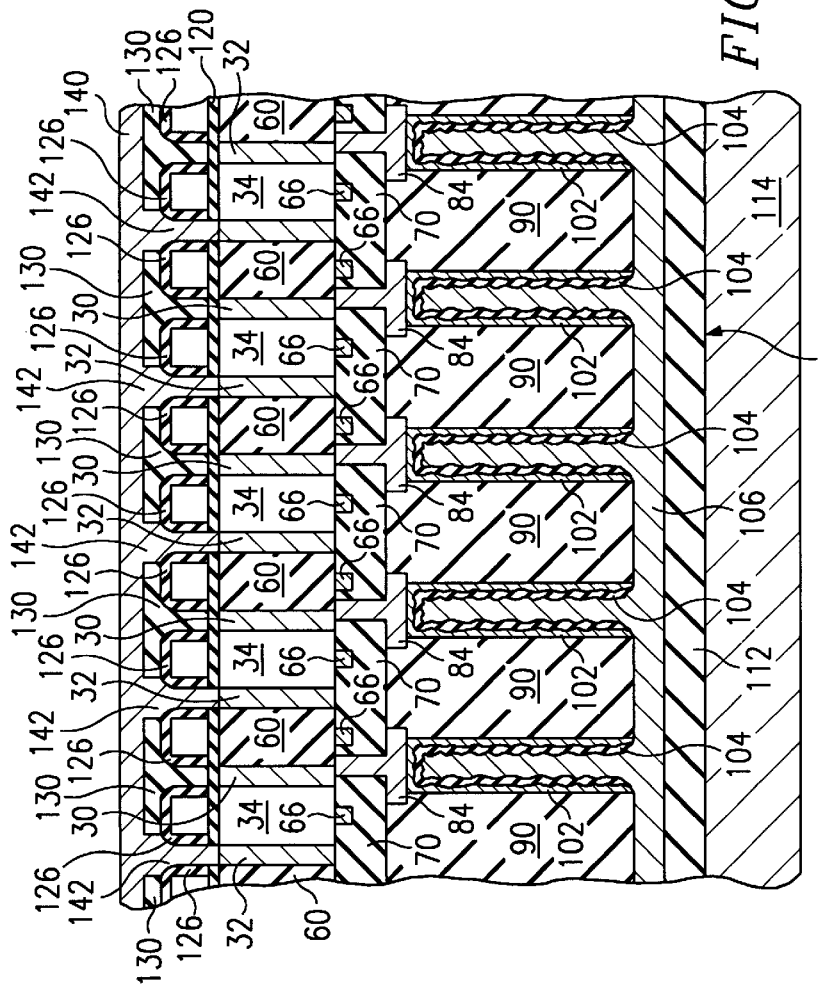
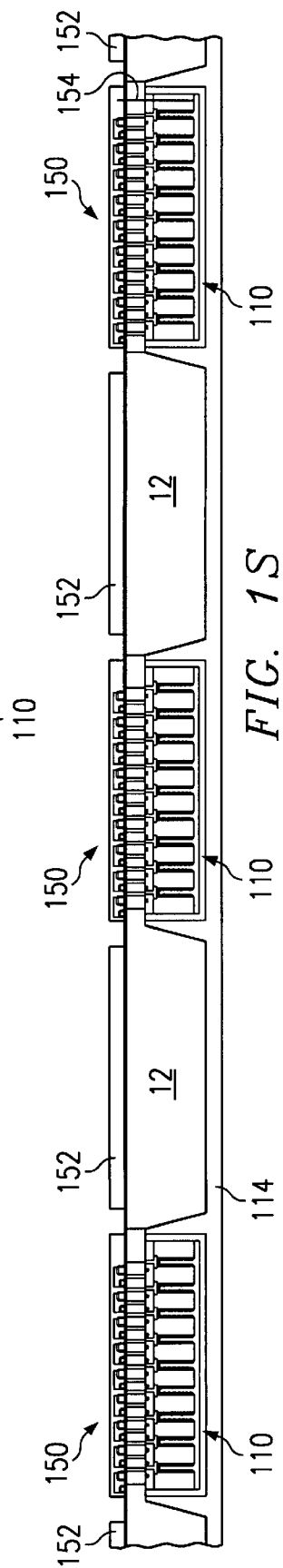
FIG. 1R
FIG. 1S

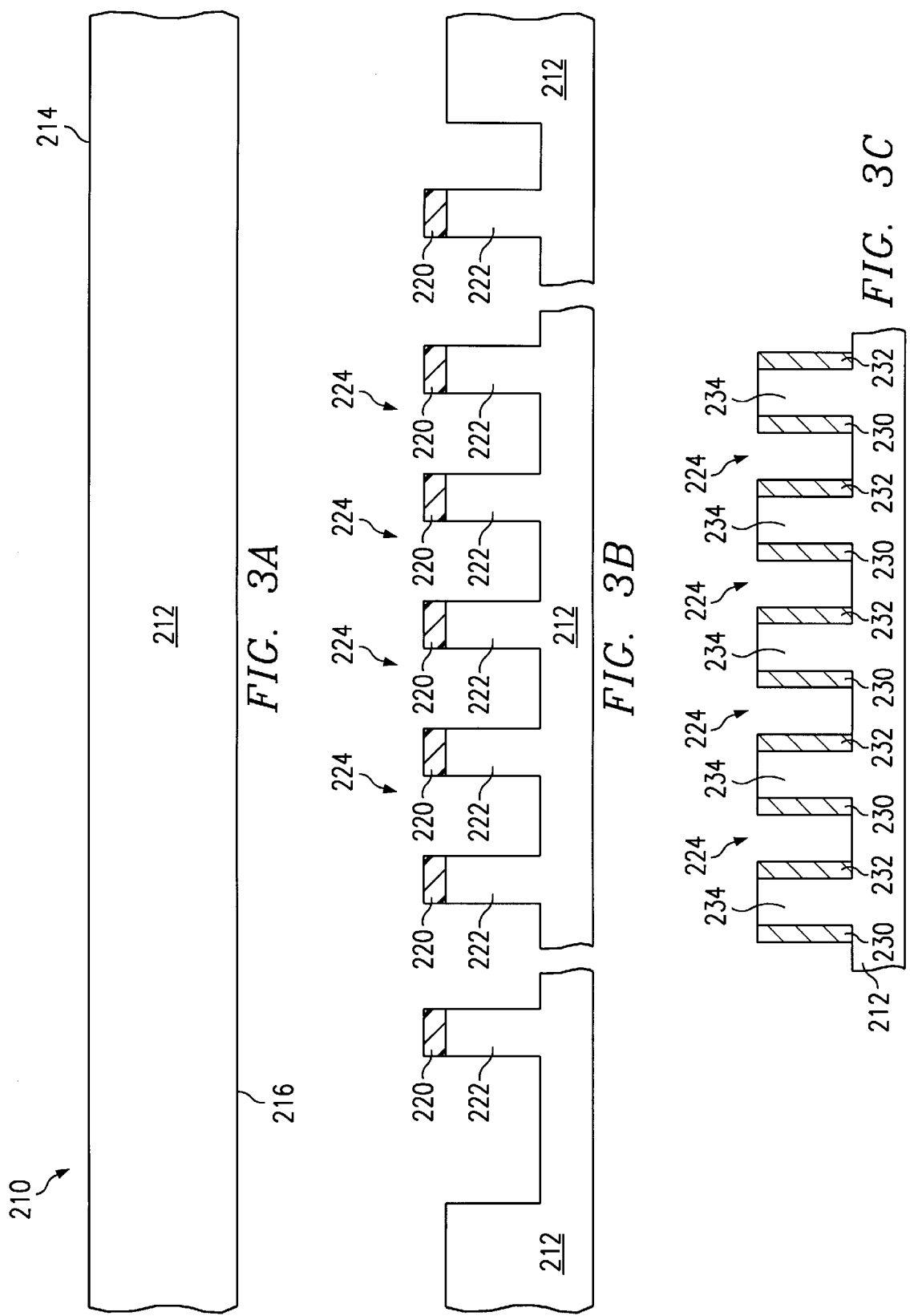

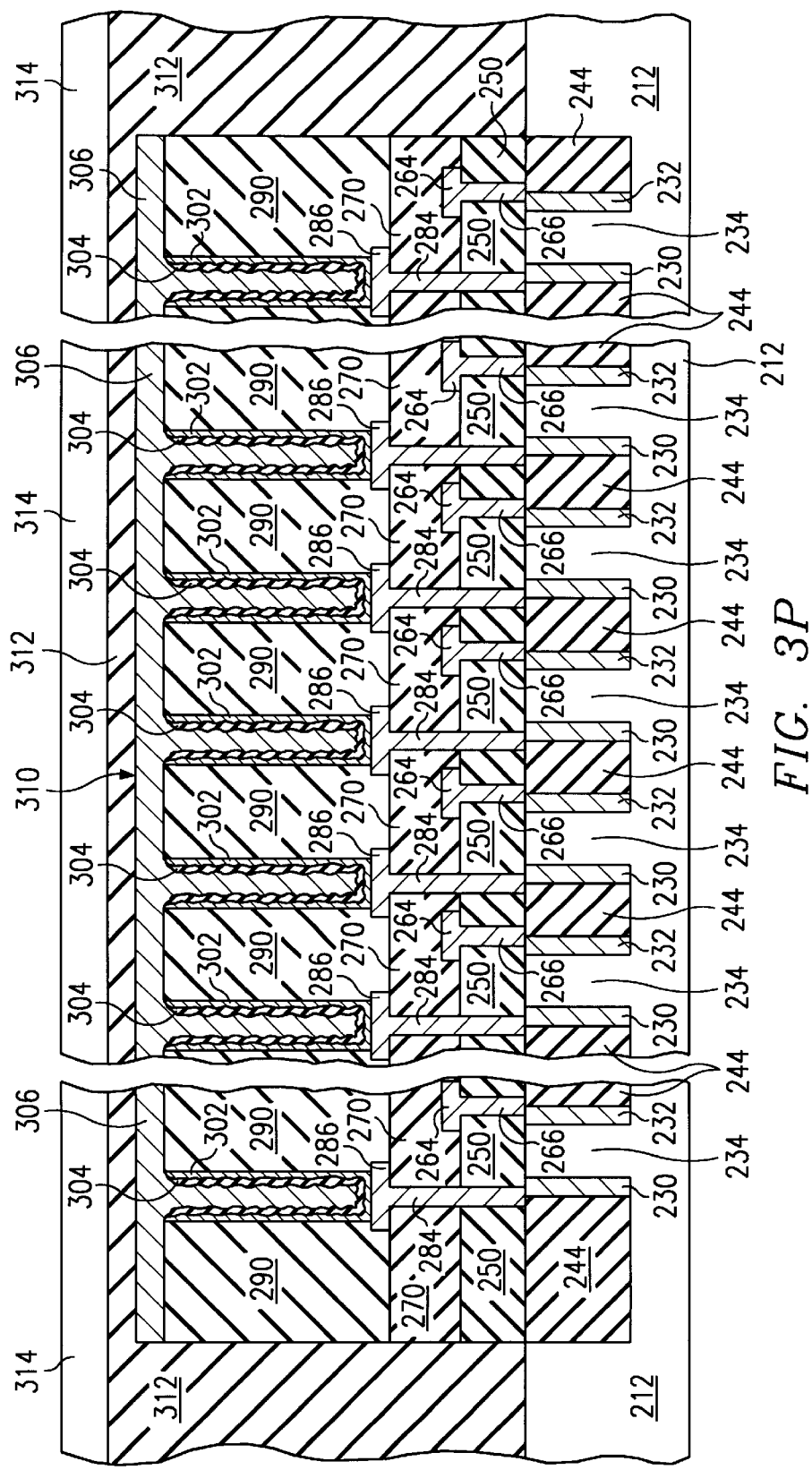

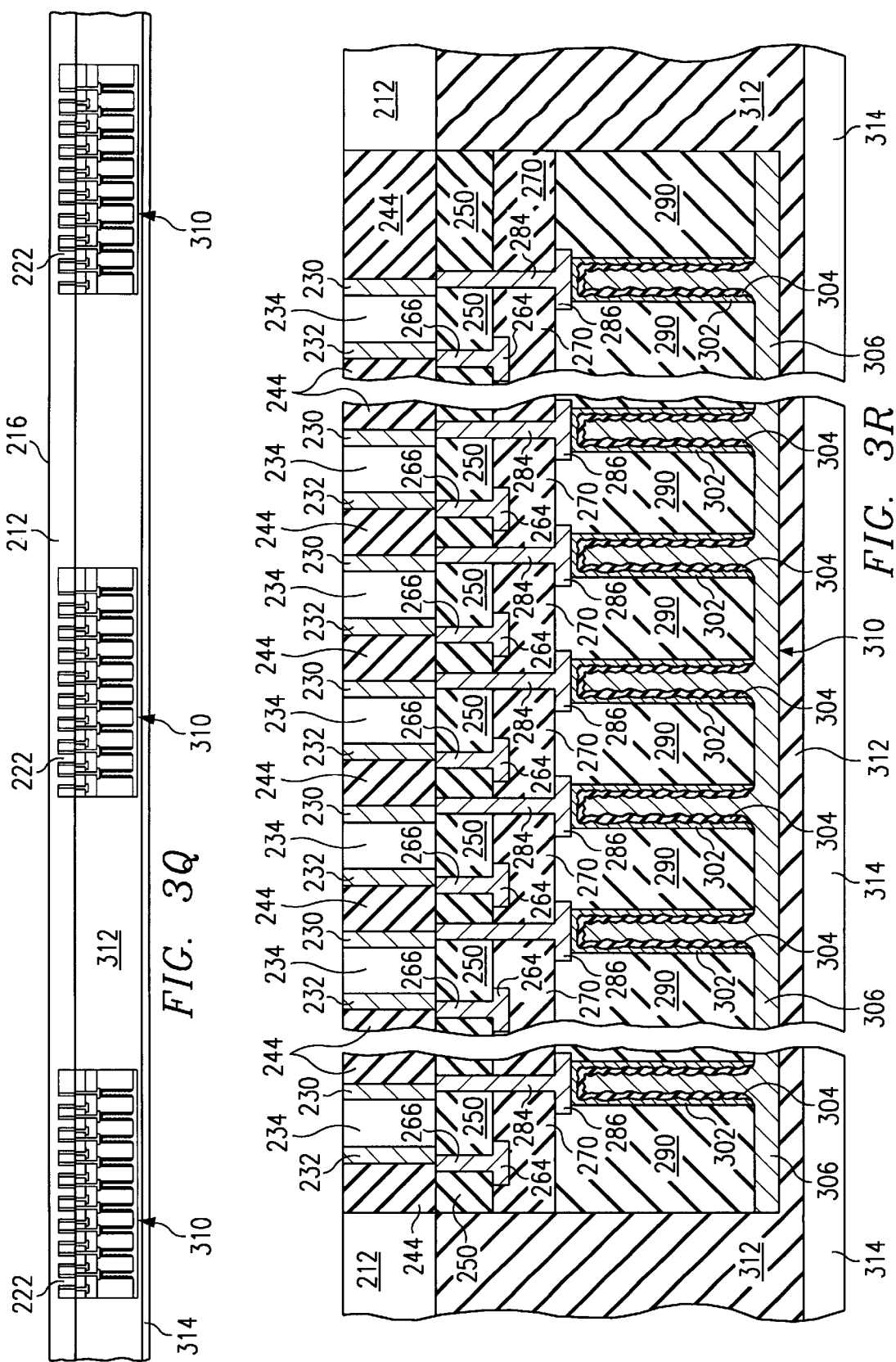

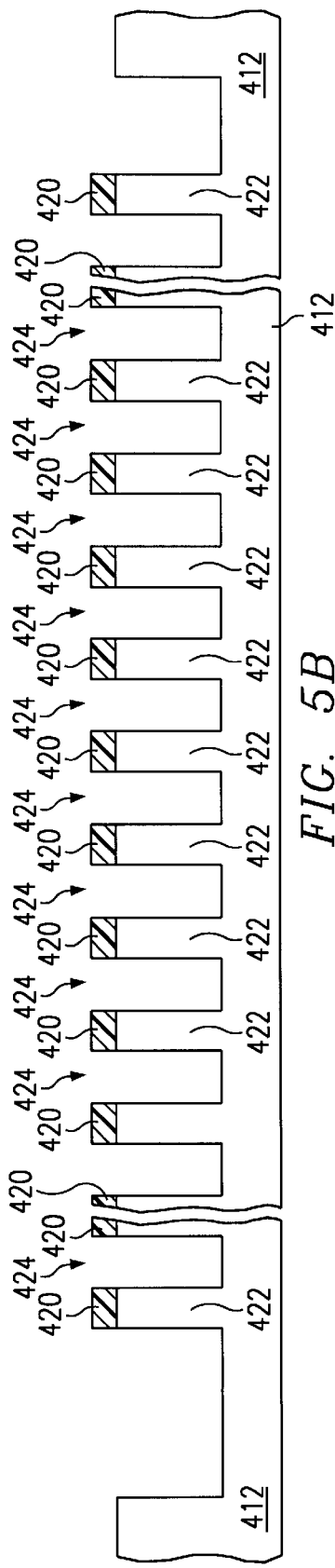

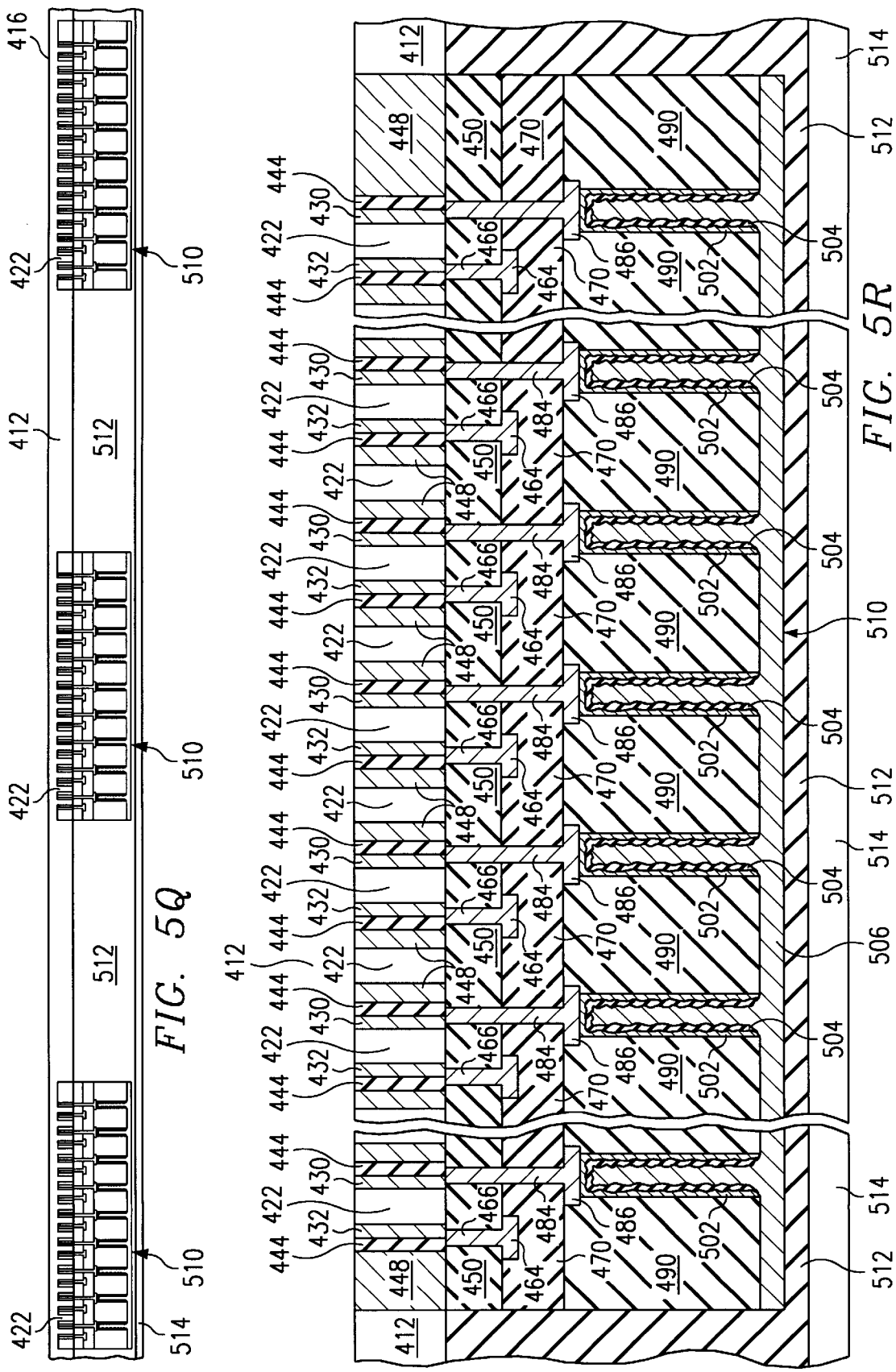

METHOD OF FORMING A GATE DEVICE WITH RAISED CHANNEL

RELATED APPLICATIONS

This application claims priority under 35 USC §119(e)(1) of provisional application number 60/102,359 filed Sep. 29, 1998.

This application is related to copending U.S. application Ser. No. 09/405,826, entitled "Gate Device with Access Channel Formed in Discrete Post and Method" and copending U.S. application Ser. No. 09/400,688, entitled "Method for Two-Sided Fabrication of a Memory Array".

TECHNICAL FIELD OF THE INVENTION

This invention relates generally to electronic devices, and more particularly to a gate device with a raised channel and to a method for fabricating the same.

BACKGROUND OF THE INVENTION

Modern electronic equipment such as televisions, telephones, radios and computers are generally constructed of solid state devices. Solid state devices are preferred in electronic equipment because they are extremely small and relatively inexpensive. Additionally, solid state devices are very reliable because they have no moving parts, but are based on the movement of charge carriers.

Solid state devices may be transistors, capacitors, resistors, and other semiconductor devices. Typically, such devices are fabricated on a substrate and interconnected to form memory arrays, logic structures, timers and other integrated circuits. One type of memory array is a dynamic random access memory (DRAM) in which memory cells retain information only temporarily and are refreshed at periodic intervals. Despite this limitation, DRAMs are widely used because they provide low cost per bit of memory, high device density, and feasibility of use.

DRAMs typically include an array of memory cells accessed by a series of word lines and bit lines. Each memory cell includes an access transistor coupled to a storage capacitor. The access transistor is formed from a portion of a word line disposed over a channel that is defined in an underlying substrate. A source and drain for the access transistor are also defined in the substrate. The source is shared with an adjacent access transistor and connected to a bit line. The drain is connected to the storage node.

Efforts to increase DRAM density have concentrated on minimizing the planar area of the memory cells. The planar area of the cells, however, is constrained by the configuration of the access transistor, the storage node, the word line, and the bit line.

SUMMARY OF THE INVENTION

In accordance with the present invention, an improved gate device and method are provided that substantially eliminate or reduce disadvantages and problems associated with previously developed systems and methods. In particular, the present invention provides a high density gate device for a memory array or other integrated circuit.

In one embodiment of the present invention, a method for fabricating a gate device includes forming an elongated projection on a substrate. The elongated projection protrudes from a surrounding area of the substrate and includes an access channel for the gate device. A first terminal and a second terminal are formed and coupled to the access channel in the elongated projection. A gate structure is formed and operable to control the access channel to selectively couple the first terminal to the second terminal through the access channel in the elongated projection.

More specifically, in accordance with one embodiment of the present invention, the gate device is used for a memory cell. In this embodiment, a storage node is coupled to the first terminal and a bit line is coupled to the second terminal. The gate structure is operable to control the access channel to selectively couple the bit line to the storage node.

Technical advantages of the present invention include providing a very high density gate device for memory arrays and other integrated circuits. In particular, the gate device has a raised channel formed in an elongated projection with individual source and drain terminals for the channel. The terminals may be formed in or adjacent to the elongated projection. In either case, the use of individual source and drain terminals allows the gate device to be scaled down to minimal isolation between devices.

Other technical advantages of the present invention will be readily apparent to one skilled in the art from the following figures, description, and claims.

BRIEF DESCRIPTION OF THE DRAWINGS

For a more complete understanding of the present invention and its advantages, reference is now made to the following description taken in conjunction with the accompanying drawings, in which.

DETAILED DESCRIPTION OF THE INVENTION

Figure 1C:
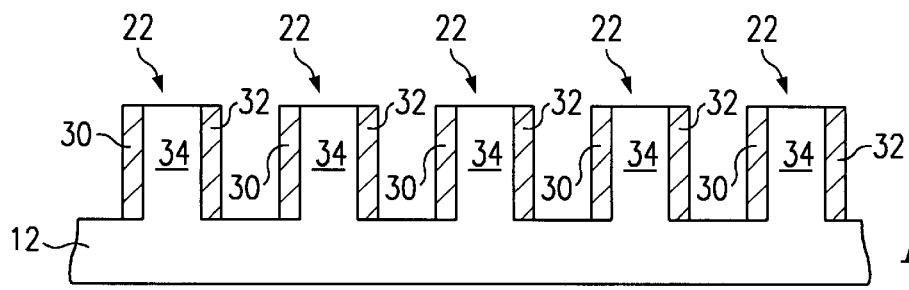
FIGS. 1A–S are a series of schematic cross-sectional diagrams illustrating fabrication of a memory array in accordance with one embodiment of the present invention.

The preferred embodiments of the present invention and their advantages are best understood by referring to FIGS. 1–6 of the drawings, in which like numerals refer to like parts throughout the several views.

FIGS. 1 and 2 illustrate fabrication of a memory array in accordance with one embodiment of the present invention. For the embodiment of FIGS. 1 and 2, the memory array is a high-density dynamic random access memory (DRAM) having tight pitch memory cells. Each memory cell includes a storage node, a gate device to control access to the storage node, and a bit line to access the storage node. The memory cells, storage nodes, gate devices, and method of the present invention may be used in connection with other suitable types of memory cells, memory arrays, and electronic circuits.

Referring to FIG. 1A, an initial DRAM structure 10 includes a substrate 12 having a first side 14 and a second, opposite side 16. The substrate 12 may be a semiconductive or insulative wafer, an epitaxial or other layer formed on a wafer or other underlying structure, a semiconductor on insulator (SOI) system, and the like. As described in more detail below, a first portion of the DRAM is formed on the first side 14 of the substrate 12 while a second portion of the DRAM is formed on the second side 16 of the substrate 12. As a result, topology of the DRAM is improved, which reduces process complexity and cost while increasing yield.

A plurality of recesses 18 are formed on the first side 14 of the substrate 12. The recesses 18 are formed by a conventional wet etch or other suitable process. The recesses 18 are each sized for formation of the first portion of a sub-array for the DRAM. The second portion of each sub-array is fabricated on the second side 16 of the substrate 12 opposite the first portion of the sub-array. For a 64 megabyte DRAM, the substrate 12 includes sixteen (16) recesses 18 each sized for formation of a four (4) megabyte sub-array. The sub-arrays may use a conventional layout scheme to allow bit line compare.

Referring to FIG. 1B, an exemplary recess 18 is illustrated to describe fabrication of the first portion of the sub-array. Other first portions of other sub-arrays for the DRAM are similarly fabricated in other recesses 18 using the same process steps. A photolithographic mask 20 is conventionally formed outwardly from the first side 14 of the substrate 12. The mask 20 is patterned to form a plurality of discrete posts 22 on the first side 14 of the substrate 12. The posts 22 are discrete in that each post 22 is separate and distinct from the other posts. As described in more detail below, the discrete posts 22 each protrude from a surrounded area 24 of the first side 14 of the substrate 12 and include an access channel of a gate device for a memory cell. The access channel comprises semiconductor or other suitable material that is operable to be controlled by a later formed gate structure to selectively couple different elements of the gate device to each other to allow access to the memory cell. The discrete post 22 may be formed directly from the substrate 12, from one or more intermediate layers disposed between the mask 20 and the substrate 12, or a combination of the substrate 12 and one or more intermediate layers.

For the embodiment of FIG. 1B, the mask 20 is formed directly on the first side 14 of the substrate 12. Portions of the substrate 12 exposed by the mask 20 are etched through the mask 20 to form the discrete posts 22 from the substrate 12. In this embodiment, the substrate 12 comprises slightly doped silicon or other suitable semiconductor material. The etch is a conventional anisotropic etch, other suitable etch, or other suitable series of etches capable of removing a portion of the exposed substrate 12. After the etch process, the mask 20 may be conventionally removed from the discrete posts 22 or may remain in place to protect the top of the discrete posts 22 from doping to form a first terminal and a second terminal for each gate device in the discrete posts 22.

Referring to FIG. 1C, a first terminal 30 and a second terminal 32 are formed in each discrete post 22. As used herein, each means each of at least a subset of the identified items. An access channel 34 is defined in each discrete post 22 between the first and second terminals 30 and 32. The access channel 34 forms a path between the first and second terminals 30 and 32 that is operable to be controlled by a later formed gate structure to selectively couple the first terminal 30 to the second terminal 32 to allow access to the memory cell. Together, the later formed gate structure, the first and second terminals 30 and 32, and the access channel 34 form the gate device for the memory cell. The first and second terminals 30 and 32 are a source and a drain or other suitable types of electrodes for the gate device. For the exemplary DRAM embodiment of FIGS. 1 and 2, the gate devices are metal oxide semiconductor field effect transistors (MOSFET).

Figure 2A:
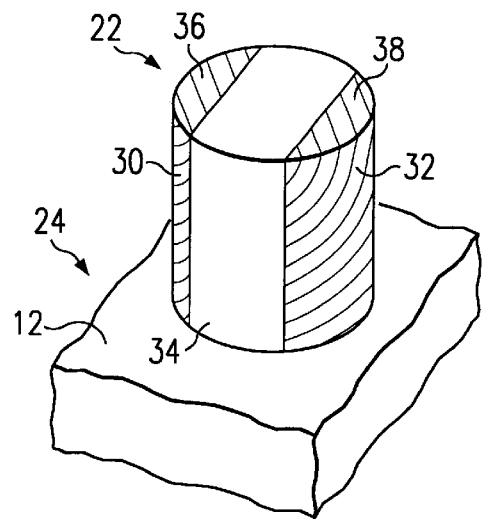
FIGS. 2A–E are a series of top-plan and perspective diagrams illustrating the memory array of FIG. 1 at different stages of the fabrication process.

FIG. 2A is a perspective diagram illustrating the first and second terminals 30 and 32 and the access channel 34 in the discrete post 22. Referring to FIG. 2A, the first terminal 30 is formed at a first edge 36 of the discrete post 22 and the second terminal 32 is formed at a second, opposite edge 38 of the discrete post 22. The access channel 34 is defined in the discrete post 22 between the first and second terminals 30 and 32. Accordingly, the gate device has a raised channel with individual source and drain terminals 30 and 32. The individual terminals 30 and 32 allow the gate devices to be scaled down to minimal isolation between devices. Accordingly, very high density DRAM and other memory arrays or integrated circuits may be fabricated.

The height of the discrete post 22 is preferably minimized to reduce resistance in the first and second terminals 30 and 32. However, depending on planarizing techniques later used to expose the discrete post 22 on the second side 16 of the substrate 12, the height of the discrete post 22 may be increased to ensure that the discrete post 22 remain after planarization.

Figure 2B:
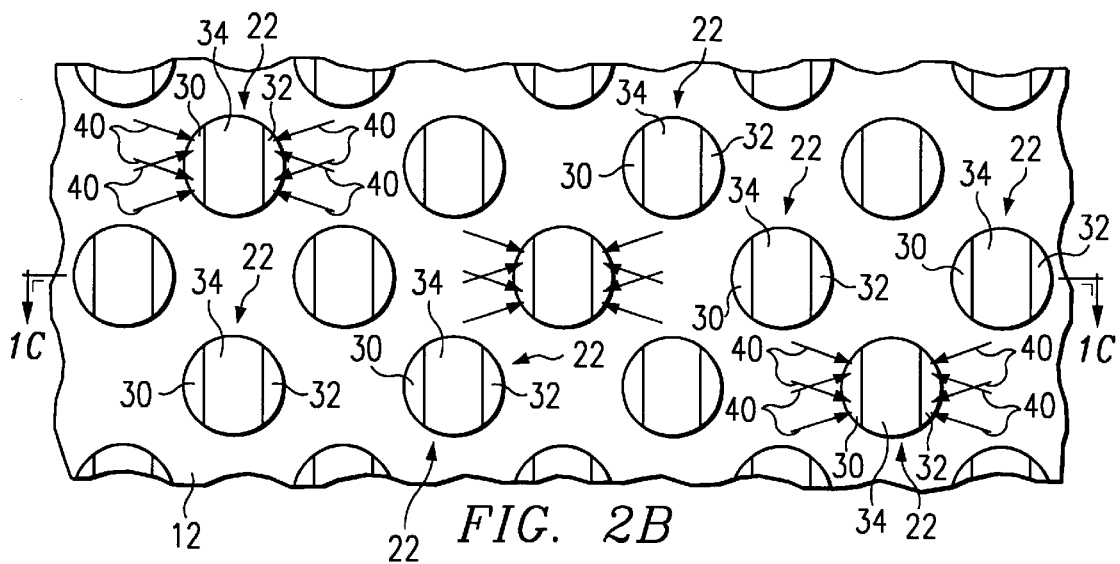
Figure 2C:
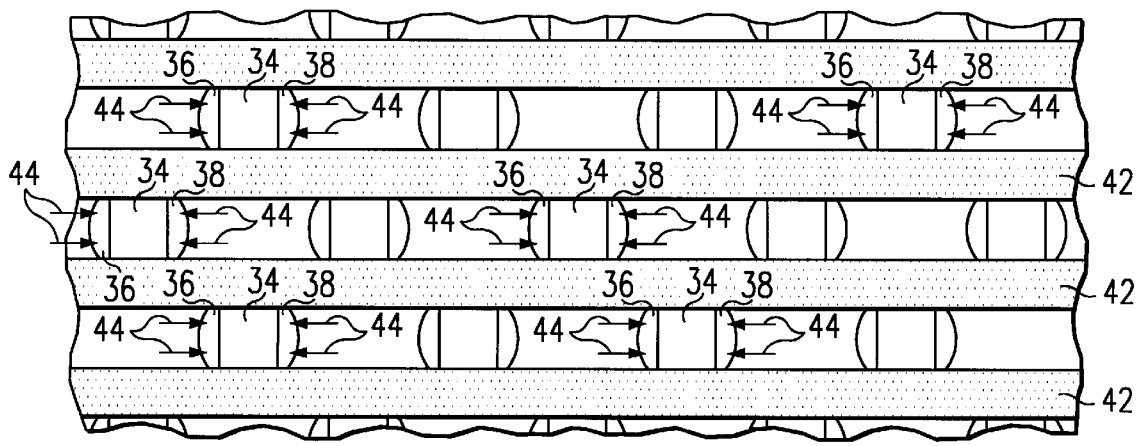
Figure 2D:
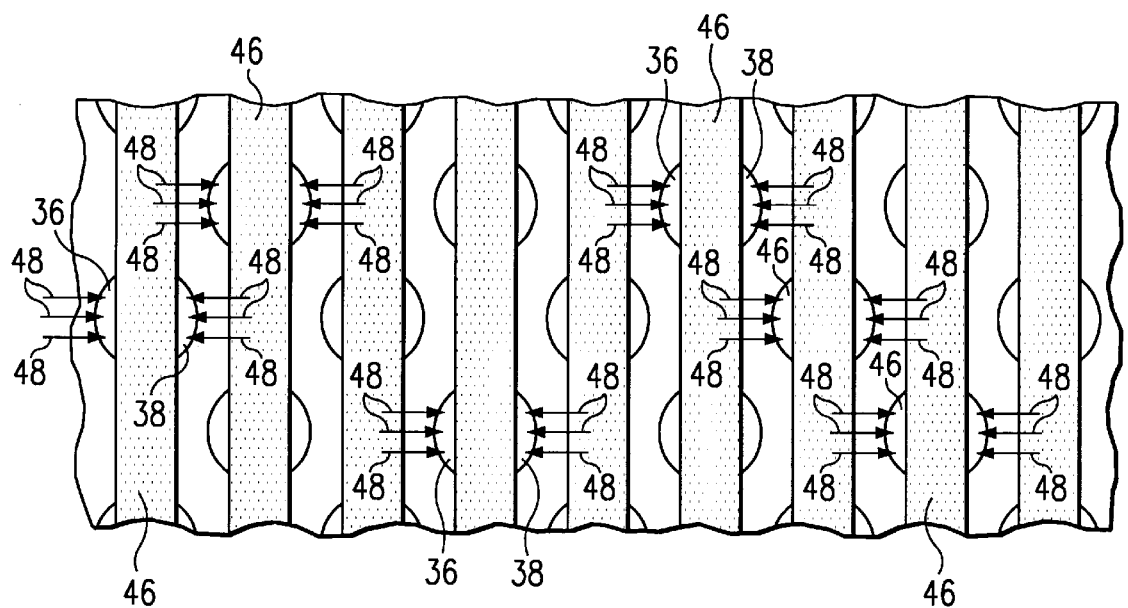

FIGS. 2B–D are a series of top-plan views illustrating formation of the first and second terminals 30 and 32 in the discrete posts 22 in accordance with several embodiments of the present invention. In these embodiments, the first and second terminals 30 and 32 are formed in the discrete posts 22 by dopant implantation.

Referring to FIG. 2B, dopants 40 are directionally implanted at an angle into the discrete posts 22 to form the first terminals 30 at the first edges 36 of the discrete posts 22 and the second terminals 32 at the second edges 38 of the discrete posts 22. In this embodiment, the mask 20 remains in place to keep the first and second terminals 30 and 32 separate at the top of the discrete posts 22. The dopants 40 are angled to provide full coverage along the height of the discrete posts 22 and directed such that each row of discrete posts 22 protects the access channels 34 in the next row of discrete posts 22 from dopant implantation and thus keeps the terminals 30 and 32 separate along the height of the discrete posts 22. The angle and direction of the dopants 40 are varied based on the height, size, and spacing of the discrete posts 22 and other suitable criteria.

Referring to FIG. 2C, the surrounding area 24 between the discrete posts 22 on the first side 14 of the substrate 12 is conventionally backfilled by growing a thermal oxide on the discrete posts 22 and on the surrounding area 24 of the first side 14 of the substrate 12 followed by an oxide fill. A photolithographic mask 42 is conventionally formed outwardly of the discrete posts 22 and the backfill layer. The mask 42 exposes the first and second edges 36 and 38 of the discrete posts 22 as well as the portion of the access channels 34 between the first and second edges 36 and 38 at the top of the discrete posts 22. Portions of the backfill layer exposed by the mask 42 are conventionally removed to fully expose the first and second edges 36 and 38 along the height of the discrete posts 22. Dopants 44 are implanted from opposite directions and at an angle into the tops, first edges 36, and second edges 38 of the discrete posts 22 to form the first terminals 30 at the first edges 36 of the discrete posts 22 and the second terminals 32 at the second edges 38 of the discrete posts 22. The angle of dopant implant is varied based on the height and spacing of the discrete posts 22 and other suitable criteria. After the doping process is complete, the mask 42 and remaining backfill layer are conventionally removed. The tops of the discrete posts 22 are conventionally planarized to remove the doped section of the access channel regions and separate the first and second terminals 30 and 32 in the discrete posts 22.

Referring to FIG. 2D, the surrounding area 24 between the discrete posts 22 on the first side 14 of the substrate 12 is conventionally backfilled and a photolithographic mask 46 is conventionally formed outwardly of the discrete posts 22 and the backfill layer. The mask 46 is patterned to expose only the first and second edges 36 and 38 of the discrete posts 22. Portions of the backfill layer exposed by the mask 46 are conventionally removed to fully expose the first and second edges 36 and 38 along the height of the discrete posts 22. Dopants 48 are implanted from opposite directions and at an angle into the first and second edges 36 and 38 of the discrete posts 22 to form the first terminals 30 at the first edges 36 of the discrete posts 22 and the second terminals 38 at the second edges of the discrete posts 22. The angle of dopant implant is varied based on the height and spacing of the discrete posts 22 and other suitable criteria. After the doping process is complete, the mask 46 and remaining backfill layer are conventionally removed.

Figure 1D:
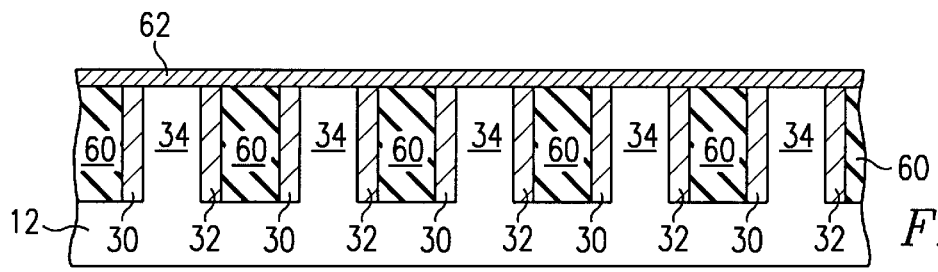

Referring to FIG. 1D, a fill layer 60 is formed outwardly from the first side 14 of the substrate 12 in the surrounding area 24 between the discrete posts 22. The fill layer 60 comprises a dielectric material capable of insulating the first and second terminals 30 and 32 of each discrete post 22 from each other and from other terminals 30 and 32 of other discrete posts 22. For the exemplary DRAM embodiment of FIGS. 1 and 2, the fill layer 60 comprises conventionally deposited oxide.

A bias strip layer 62 is formed outwardly from the discrete posts 22 and the fill layer 60. The bias strip layer 62 comprises a conductive material capable of biasing the access channels 34 in the discrete posts 22. For the exemplary DRAM embodiment of FIGS. 1 and 2, the bias strip layer 62 comprises a conventionally deposited metal.

Figure 1E:
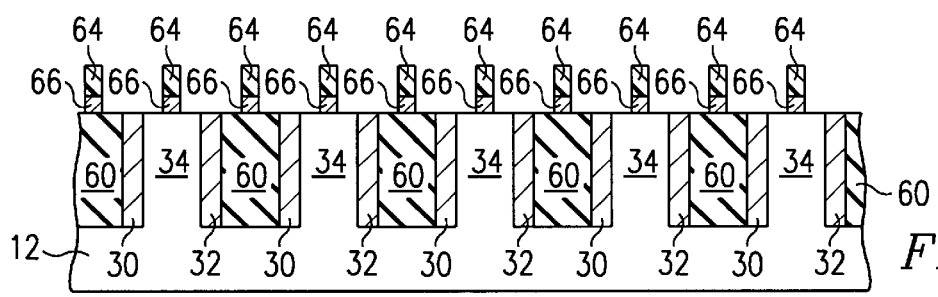

Referring to FIG. 1E, a photolithographic mask 64 is conventionally formed outwardly from the bias strip layer 62. The mask 64 is patterned to form bias strips 66 from the bias strip layer 62. The bias strips 66 couple the access channels 34 to a biasing system in order to reduce threshold voltage of the gate devices.

Portions of the bias strip layer 62 exposed by the mask 64 are etched through the mask 64 to form the bias strips 66. The etch is a conventional anisotropic etch, other suitable etch, or other suitable series of etches capable of selectively removing the exposed material of the bias strip layer 62 from the discrete posts 22 and the fill layer 60. After the etched process, the mask 64 is conventionally removed from the bias strips 66.

Figure 1F:
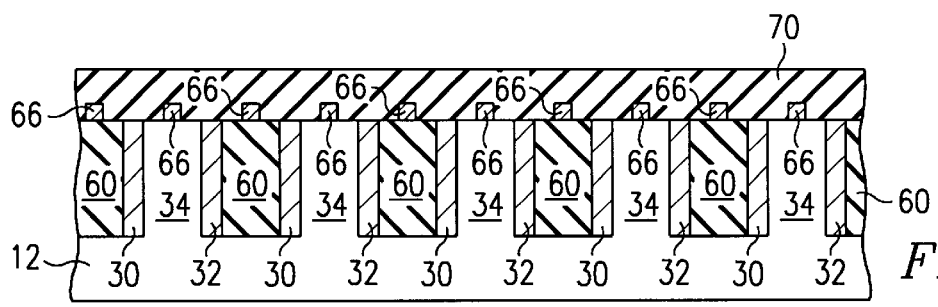

Referring to FIG. 1F, an insulative layer 70 is formed outwardly from the discrete posts 22, fill layer 60, and bias strips 66. The insulative layer 70 comprises a dielectric material capable of insulating the bias strips 66 from the later formed elements of the DRAM. For the exemplary DRAM embodiment of FIGS. 1 and 2, the insulative layer 70 comprises a conventionally deposited oxide.

Figure 1G:
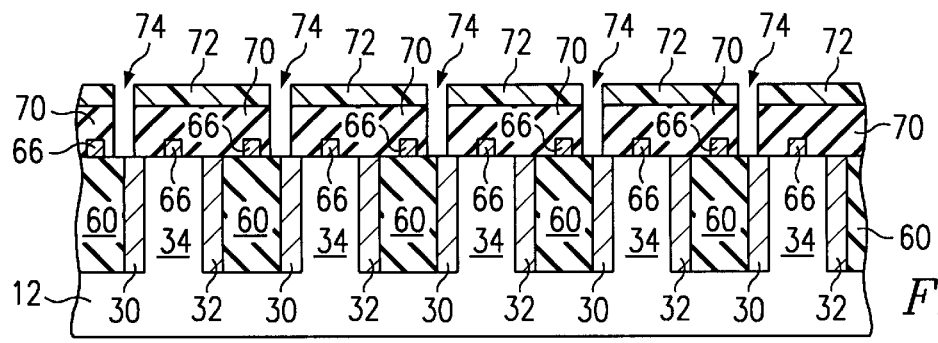

Referring to FIG. 1G, a photolithographic mask 72 is conventionally formed outwardly from the insulative layer 70. The mask 72 is patterned to form storage node contact holes 74 in the insulative layer 70. As described in more detail below, storage node contacts are formed in the contact holes 74. The storage node contacts each connect a first terminal 30 of a gate device with a later formed storage node for a memory cell.

Portions of the insulative layer 70 exposed by the mask 72 are etched through the mask 72 to form the storage node contact holes 74. The contact holes 74 expose the first terminals 30 of the discrete posts 22. The etch is a conventional anisotropic etch, other suitable etch, or other suitable series of etches capable of selectively removing the exposed material of the insulative layer 70 from the first terminals 30. After the etch process, the mask 72 is conventionally removed from the insulative layer 70.

Figure 1H:
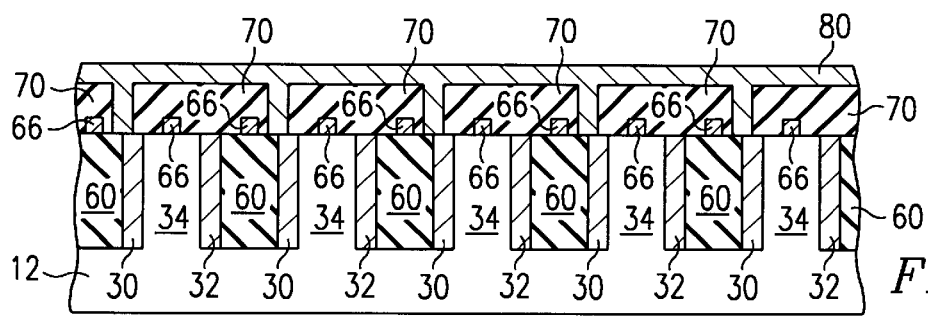

Referring to FIG. 1H, a contact layer 80 is formed outwardly from the insulative layer 70 and in the contact holes 74. The contact layer 80 comprises a conductive material capable of connecting the first terminal 30 of each gate device with a later formed storage node. For the exemplary DRAM embodiment of FIGS. 1 and 2, the contact layer 80 comprises a conventionally deposited metal.

Figure 1I:
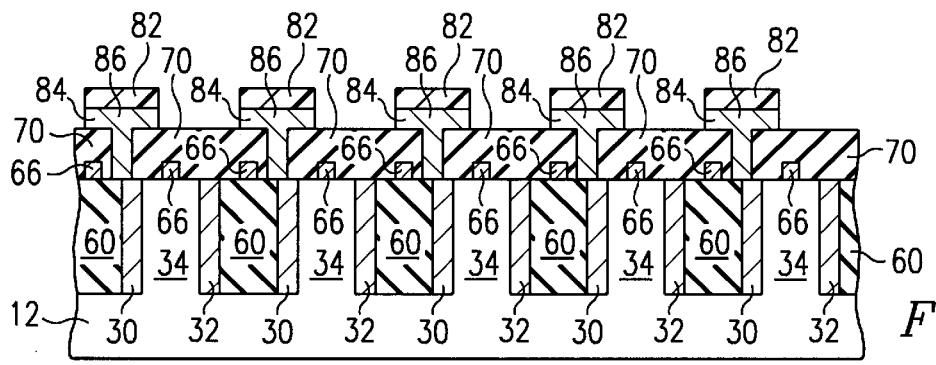

Referring to FIG. 1I, a photolithographic mask 82 is conventionally formed outwardly from the contact layer 80. The mask 82 is patterned to form storage node contacts 84 from the contact layer 80. The storage node contacts 84 each connect to a first terminal 32 and extend through an overlying contact hole 74 to provide an enlarged contact area 86 for a later formed storage node.

Portions of the contact layer 80 exposed by the mask 82 are etched through the mask 82 to form the storage node contacts 84. The etch is a conventional anisotropic etch, other suitable etch, or other suitable series of etches capable of selectively removing the exposed material of the contact layer 80 from the insulative layer 70. After the etch process, the mask 82 is conventionally removed from the contacts 84.

Figure 1J:
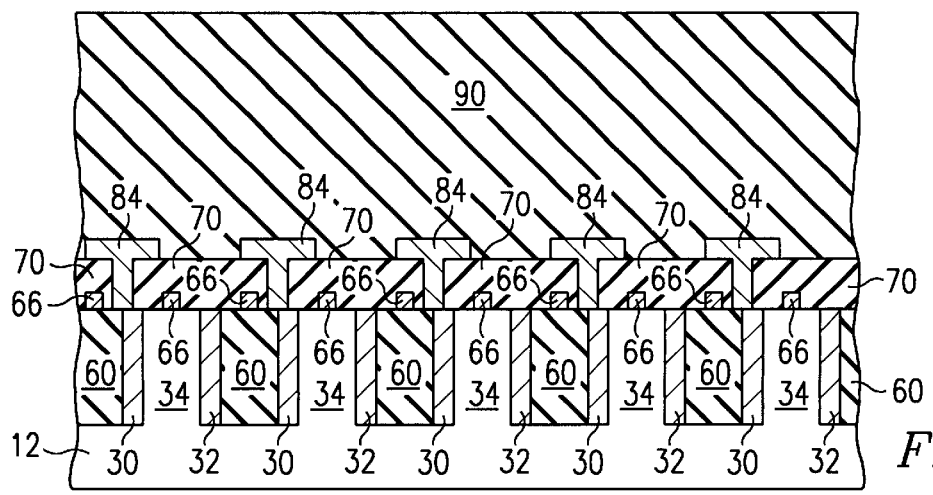

Referring to FIG. 1J, a storage node layer 90 is formed outwardly from the insulative layer 70 and the storage node contacts 84. As described in more detail below, the storage nodes are formed within the storage node layer 90. The storage node layer 90 comprises a dielectric material capable of insulating the later formed storage nodes from each other. The thickness of the storage node layer 90 is varied based on the desired height and thus capacitance of the storage nodes. For the exemplary DRAM embodiment of FIGS. 1 and 2, the storage node layer 90 comprises a conventionally deposited oxide.

Figure 1K:
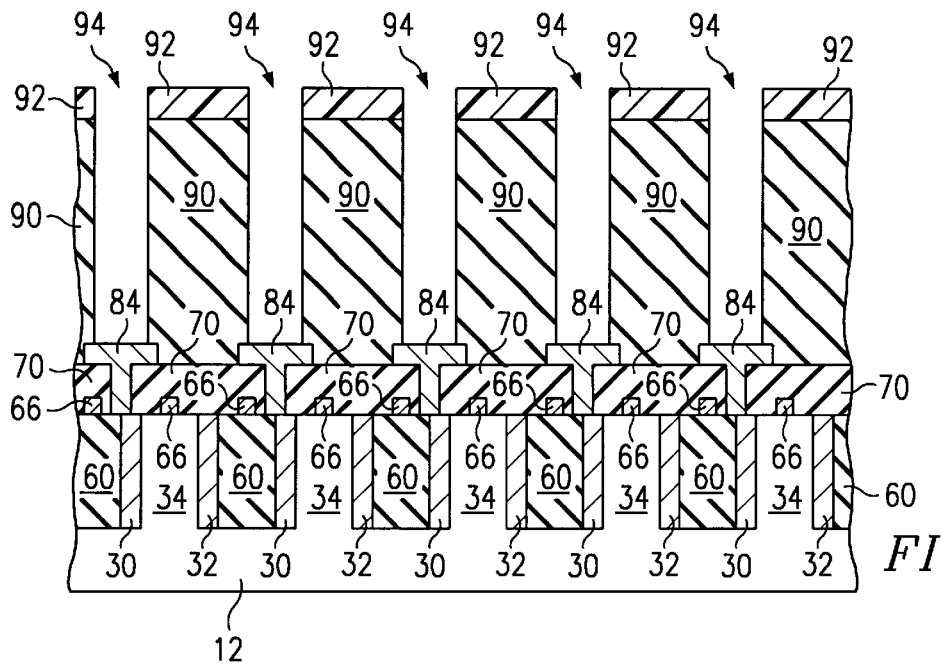

Referring to FIG. 1K, a photolithographic mask 92 is conventionally formed outwardly from the storage node layer 90. The mask 92 is patterned to form storage node holes 94 in the storage node layer 90. As described in more detail below, storage nodes for the memory cells are formed in the storage node holes 94. These storage nodes each store information for a memory cell.

Portions of the storage node layer 90 exposed by the mask 92 are etched through the mask 92 to form the storage node holes 94. The storage node holes 94 expose the storage node contacts 84. The etch is a conventional anisotropic etch, other suitable etch, or other suitable series of etches capable of selectively removing the exposed material of the storage node layer 90 from the storage node contacts 84. The storage node contacts 84 preferably act as an etch stop to the deep etch of the storage node layer 90. After the etch process, the mask 92 is conventionally removed from the storage node layer 90.

Figure 1L:
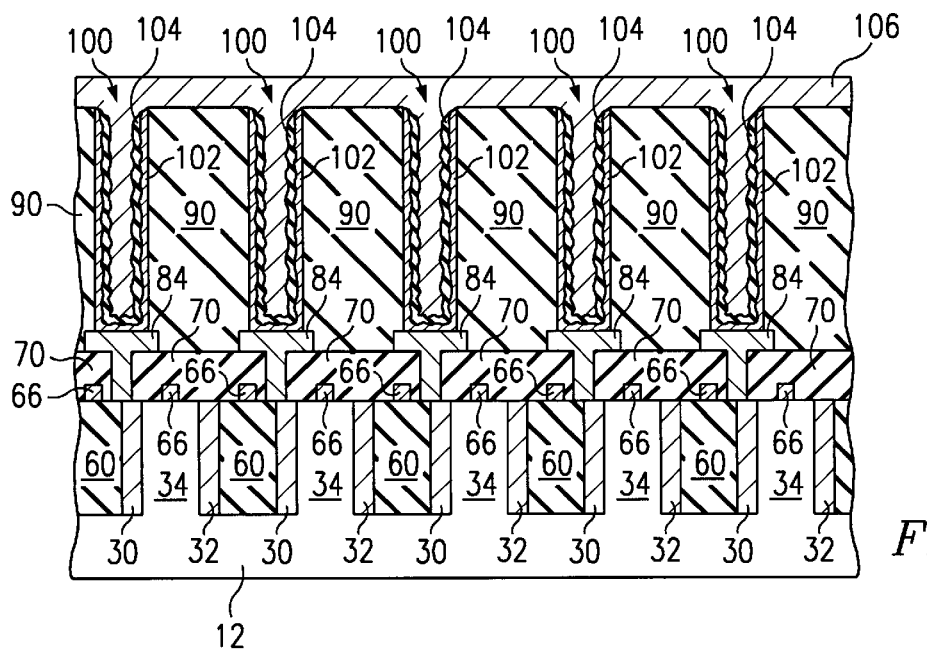
Figure 10:
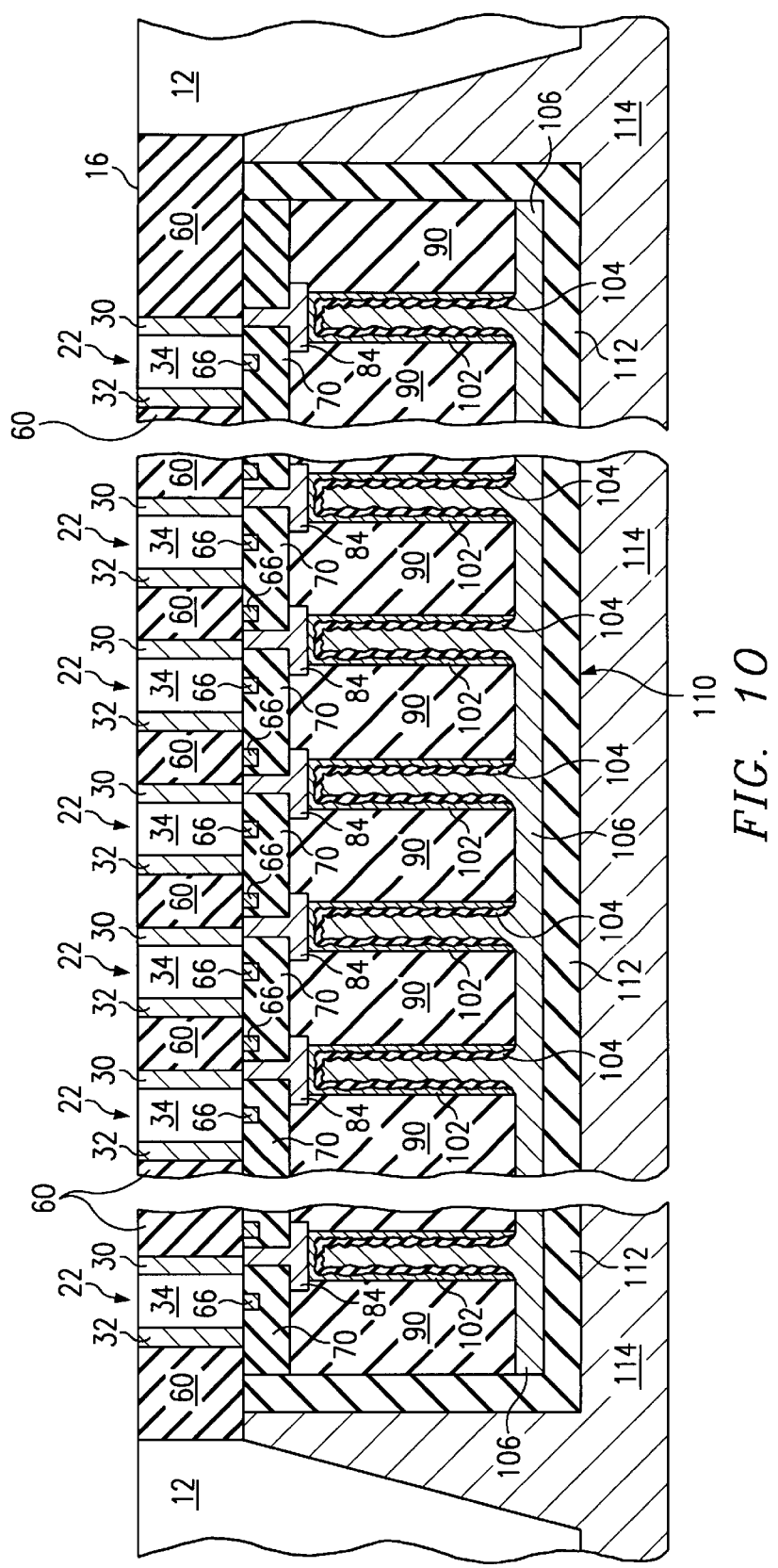

Referring to FIG. 1L, a storage node 100 is formed in a storage node hole 94 for each memory cell. For the exemplary DRAM embodiment of FIGS. 1 and 2, the storage node 100 is a stacked capacitor having a bottom electrode 102, a capacitor dielectric 104, and a top electrode 106. The bottom electrode 102 comprises a doped polysilicon layer conventionally deposited in the storage node holes 94. The doped polysilicon layer is conventionally ruggedized to increase the surface area between the first and second electrodes 102 and 106. The capacitor dielectric 104 comprises a nitride and oxide dielectric layer conventionally deposited outwardly from the bottom electrodes 102. The top electrode 106 is a field plate. The field plate comprises doped polysilicon deposited to fill the remaining portion of the storage node holes 94 and between the storage nodes 100. The plate material may be terminated on an oxide plug at the periphery of the subarray for easy access from the second side 16 of the substrate 12. It will be understood that the storage nodes 100 may comprise other configurations, be otherwise formed, or otherwise arranged. For example, the storage nodes 100 may be in several layers.

Referring to FIG. 1M, the first portion 110 of the sub-array, including the first and second terminals 30 and 32, access channels 34, bias strips 66, and storage nodes 100 for each memory cell of the sub-array, is isolated by an insulative cap 112. A support structure 114 is mounted to the first side 14 of substrate 12 to provide support for the substrate 12. The support structure 114 also encapsulates the first portion 110 of the sub-array and the insulative cap 114 to protect the storage nodes 100. In one embodiment, the support structure 114 comprises a conductor to allow connections between the sub-arrays and to act as a heat sink for the first portion of the DRAM.

Referring to FIG. 1N, the substrate 12 is flipped to expose the second side 16 of the substrate 12 for processing. Because of the additional support provided by the support structure 114, an excess portion of the second side 16 of substrate 12 may be removed without damaging or unacceptably weakening the substrate 12 or DRAM.

Referring to FIG. 1O, the second side 16 of substrate 12 is planarized to expose the first and second terminals 30 and 32 and the access channels 34 in the discrete posts 22. The second side 16 of the substrate may be conventionally planarized by a chemical mechanical polish (CMP), etch back, or other suitable process. The planarization is carefully controlled to ensure that the excess portion is removed without removing the discrete posts 22.

Figure 1P:
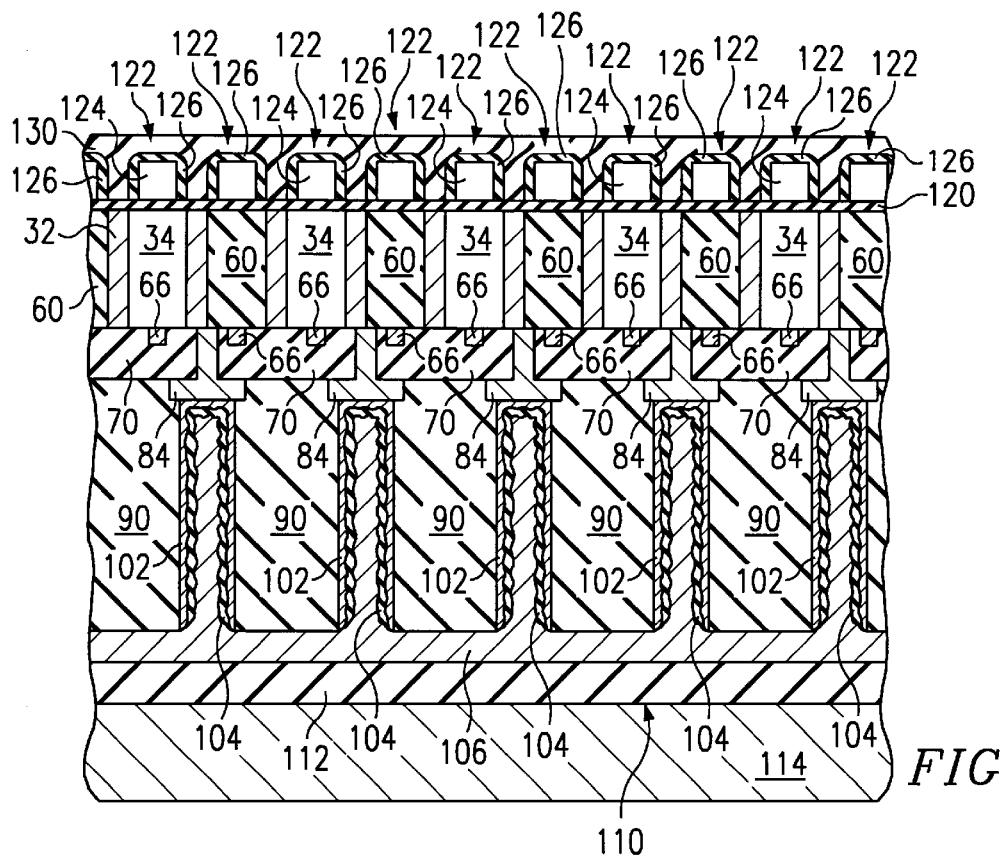
Figure 2E:
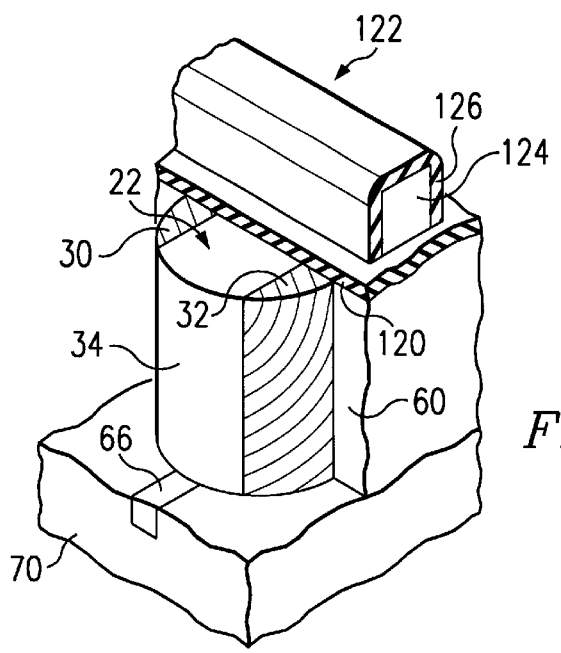

Referring to FIG. 1P, a gate dielectric layer 120 is formed outwardly from the discrete posts 22 on the second side 16 of the substrate 12. A series of gate structures 122 are formed outwardly from the dielectric layer 120. The gate structures 122 are each operable to control an underlying access channel 34 to selectively couple the first terminal 30 to the second terminal 32 to allow access to a storage node 100. The gate structures 122 may each be disposed over an access channel 34 between the first and second terminals 30 and 32 or otherwise suitably disposed. For example, as shown in FIG. 2E, the gate structure 122 may be disposed over the first and second terminals 30 and 32 in addition to the access channel 34. In this embodiment, the isolation interface problems are reduced.

Each gate structure 122 together with the associated access channel 34 and terminals 30 and 32 form a gate device for a memory cell. For the exemplary DRAM embodiment of FIGS. 1 and 2, the gate devices are MOSFET devices and the gate structures are conventionally formed word lines comprising a gate 124 and a sidewall insulator 126.

An insulative layer 130 is formed outwardly from the gate dielectric layer 120 and the gate structures 122. The insulative layer 130 comprises a dielectric material capable of insulating later formed bit line contacts. For the exemplary DRAM embodiment of FIGS. 1 and 2, the insulative layer 130 comprises a conventionally deposited oxide.

Figure 1Q:
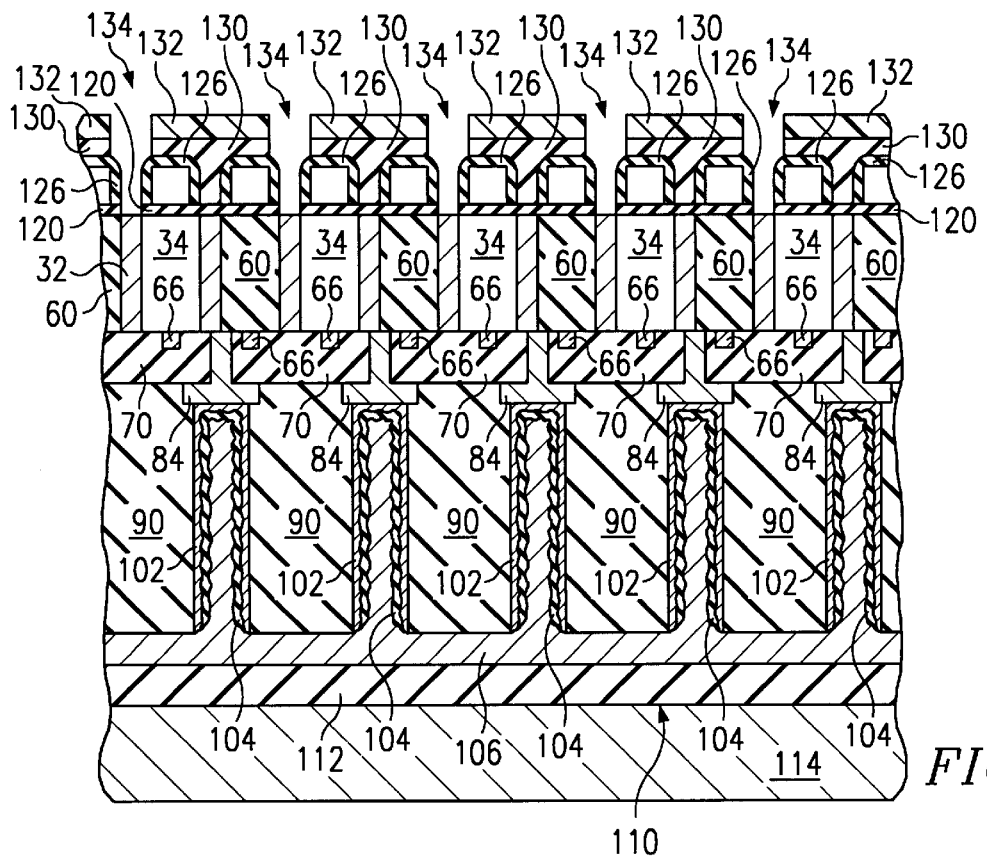

Referring to FIG. 1Q, a photolithographic mask 132 is conventionally formed outwardly from the insulative layer 130. The mask 130 is patterned to form bit line contact holes 134 in the insulative layer 130. As described in more detail below, bit line contacts are formed in the contact holes 134. The bit line contacts each connect a second terminal 32 of a gate device with a later formed bit line.

Portions of the insulative layer 130 exposed by the mask 132 are etched through the mask 132 to form the bit line contact holes 134. The contact holes 134 expose the second terminals 32 of the discrete posts 22. The etch is a conventional anisotropic etch, other suitable etch, or other suitable series of etches capable of selectively removing the exposed material of the insulative layer 130 from the second terminals 32. After the etch process, the mask 132 is conventionally removed from the insulative layer 130.

Referring to FIG. 1R, a bit line layer 140 is formed outwardly from the insulative layer 130 and in the contact holes 134. The bit line layer 140 comprises a conductive material capable of forming bit lines. For the exemplary DRAM embodiment of FIGS. 1 and 2, the bit line layer 140 comprises a conventionally deposited metal.

The bit line layer 140 is conventionally patterned and etched using a photolithographic mask to form a series of bit lines for the sub-array. The bit lines each include a plurality of bit line contacts 142 to couple a plurality of memory cells to a sensing circuit for reading accessed information. Information in the sub-array is accessed using the word lines to couple the bit lines to the storage nodes 100 and the bit lines to relay the stored information to a sensing circuit. The word lines and bit lines are controlled by conventional addressing logic.

For the exemplary DRAM embodiment, the discrete posts 22 each have a 0.6 micron diameter with the terminals 30 and 32 and the access channels 34 each having a width of 0.2 microns. The word lines each have a width of 0.2 microns and a spacing of 0.2 microns. The bit lines also have a width of 0.2 microns and a spacing of 0.2 microns. The storage nodes each have an area that is 0.4 microns by 0.2 microns.

Referring to FIG. 1S, the first portion 110 and the second portion 150 of the DRAM sub-arrays are illustrated. Peripheral circuit devices 152 may be formed between the sub-arrays using the process steps to form the second portion of the sub-arrays or other suitable processes. Additional contacts 154 between the first and second portion of the sub-array may also be formed using the same or other suitable fabrication steps.

As shown by FIG. 1S, because the storage nodes 100 are formed on the first 14, or backside, of the substrate 12, the height of the storage nodes 100 may be increased without causing topological problems in the memory array. In addition, storage node materials that would otherwise conflict with other components of the memory array may also be used. Accordingly, storage node capacitance is increased without increasing fabrication costs. In addition, taller and less complex storage node configurations may be used that reduce the cost and increase yield.

FIGS. 3 and 4 illustrate fabrication of a memory array in accordance with another embodiment of the present invention. For the embodiment of FIGS. 3 and 4, the memory array is also a high-density dynamic random access memory (DRAM) having tight pitch memory cells. Each memory cell includes a storage node, a gate device to control access to the storage node, and a bit line to access the storage node. The memory cells, storage nodes, gate devices, and method of this embodiment of the present invention may also be used in connection with other suitable types of memory cells, memory arrays, and electronic circuits.

Referring to FIG. 3A, an initial DRAM structure 210 includes a substrate 212 having a first side 214 and a second, opposite side 216. The substrate 212 may be a semiconductive or insulative wafer, an epitaxial or other layer formed on a wafer or other underlying structure, a semiconductor on insulator (SOI) system, and the like. As described in more detail below, a first portion of the DRAM is formed on the first side 214 of the substrate 212 while a second portion of the DRAM is formed on the second side 216 of the substrate 212. As a result, topology of the DRAM is improved, which reduces process complexity and cost while increasing yield.

The DRAM is formed from a plurality of sub-arrays. The first portion of the sub-arrays are fabricated on the first side 214 of the substrate 212. The second portion of each sub-array is fabricated on the second side 216 of the substrate 212 opposite the first portion of the sub-array. For a 64 megabyte DRAM, the substrate 212 includes sixteen (16) sub-arrays each having four (4) megabytes of memory. The sub-arrays may use a conventional layout scheme to allow bit line compare.

Referring to FIG. 3B, an exemplary portion of the substrate 212 is illustrated to describe fabrication of a first portion of a sub-array for the DRAM. Other first portions of other sub-arrays for the DRAM are similarly fabricated using the same process steps. A photolithographic mask 220 is conventionally formed outwardly from the first side 214 of the substrate 212. The mask 220 is patterned to form a plurality of discrete posts 222 on the first side 214 of the substrate 212. The posts 222 are discrete in that each post 222 is separate and distinct from the other posts. As described in more detail below, the discrete posts 222 each protrude from a surrounding area 224 of the first side 214 of the substrate 212 and include an access channel for a gate device of a memory cell. The access channel comprises semiconductor or other suitable material that is operable to be controlled by a later formed gate structure to selectively couple different elements of the gate device to each other to allow access to the memory cell. The discrete posts 222 may be formed directly from the substrate 212, from one or more intermediate layers disposed between the mask 220 and the substrate 212, or a combination of the substrate 212 and one or more intermediate layers.

For the embodiment of FIG. 3B, the mask 220 is formed directly on the first side 214 of the substrate 212. Portions of the substrate 212 exposed by the mask 220 are etched through the mask 220 to form the discrete posts 222 from the substrate 212. In this embodiment, the substrate 212 comprises slightly doped silicon or other suitable semiconductor material. The etch is a conventional anisotropic etch, other suitable etch, or other suitable series of etches capable of selectively removing a portion of the exposed substrate 212. After the etch process, the mask 220 is conventionally removed from the discrete posts 222.

Referring to FIG. 3C, a first terminal 230 and a second terminal 232 are formed adjacent to each discrete post 222. An access channel 234 is defined in each discrete post 222 between the first and second terminals 230 and 232. The access channel 234 forms a path between the first and second terminals 230 and 232 that is operable to be controlled by a later formed gate structure to selectively couple the first terminal 230 to the second terminal 232 to allow access to the memory cell. Together, the later formed gate structure, the first and second terminals 230 and 232, and the access channel 234 form the gate device for the memory cell. The first and second terminals 230 and 232 are a source and a drain or other suitable types of electrodes for the gate device. For the exemplary DRAM embodiment of FIGS. 3 and 4, the gate devices are metal oxide semiconductor field effect transistors (MOSFET).

Figure 4A:
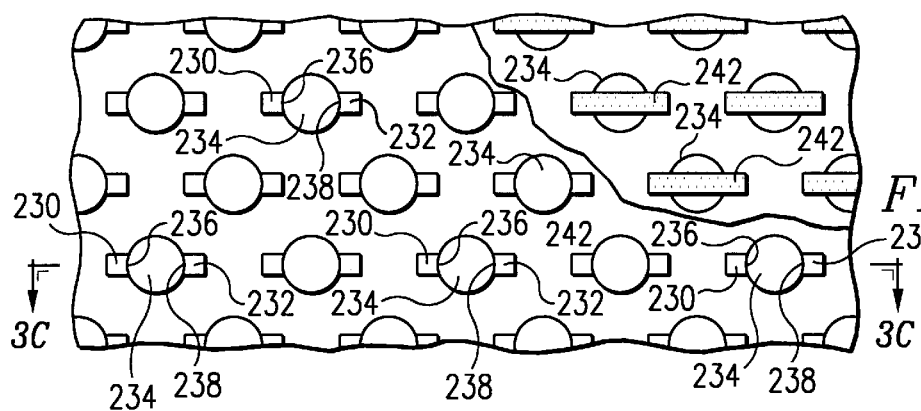
FIGS. 4A–D are a series of top-plan diagrams illustrating the memory array of FIG. 3 at different stages of the fabrication process.

FIG. 4A is a top-plan view illustrating the first and second terminals 230 and 232 formed adjacent to the discrete posts 222. Referring to FIG. 4A, the first terminal 230 is formed adjacent to a first edge 236 of each discrete post 222 and the second terminal 232 is formed adjacent to a second, opposite edge 238 of the discrete post 222. The access channel 234 is defined in the discrete posts 222 between the first and second terminals 230 and 232. Accordingly, the gate device has a raised channel with individual source and drain terminals 230 and 232. The individual terminals 230 and 232 allow the gate devices to be scaled down to minimal isolation between devices. Accordingly, very high density DRAM and other memory devices or integrated circuits may be fabricated.

The first and second terminals 230 and 232 are formed adjacent to the discrete posts 222 by conventionally depositing a conductive layer in the surrounding area 224 between the discrete posts 222 on the first side 214 of the substrate 212. A photolithographic mask 242 is conventionally formed outwardly from the discrete posts 222 and the conductive layer. The mask 242 exposes an excess portion of the conductive layer that is removed to leave first terminals 230 adjacent to the first edges 236 of the discrete posts 222 and the second terminals 232 adjacent to the second edges 238 of the discrete posts 222. The excess portion of the conductive layer is removed by a conventional anisotropic etch, other suitable etch, or other suitable series of etches capable of selectively removing the exposed material of the conductive layer from the substrate 212. After the etch process, the mask 242 is conventionally removed from the discrete posts 222 and the first and second terminals 230 and 232.

The terminals 230 and 232 are preferably a metal or other highly conductive material to minimize device resistance. The use of metal terminals 230 and 232 allows the height of the discrete posts 222 to be increased without unacceptably increasing resistance in the first and second terminals 230 and 232. Accordingly, metal terminals 230 and 232 may be preferred in applications with high discrete posts 222, high planarization tolerances, and the like.

Figure 3D:
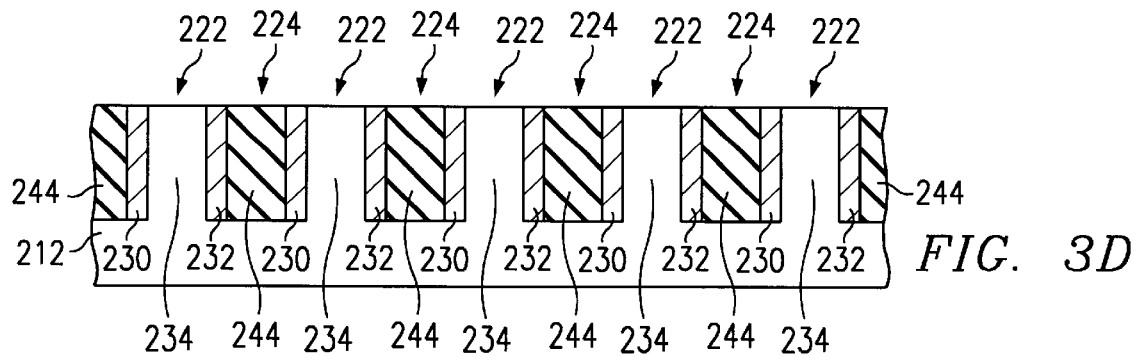
FIGS. 3A–S are a series of schematic cross-sectional diagrams illustrating fabrication of a memory array in accordance with another embodiment of the present invention.

Referring to FIG. 3D, terminal insulators 244 are formed around the exposed sides of the first and second terminals 230 and 232. The terminal insulators 244 insulate the terminals 230 and 232 from a later formed bias layer. The terminal insulators 244 comprise oxide or other suitable dielectric material.

Figure 4B:
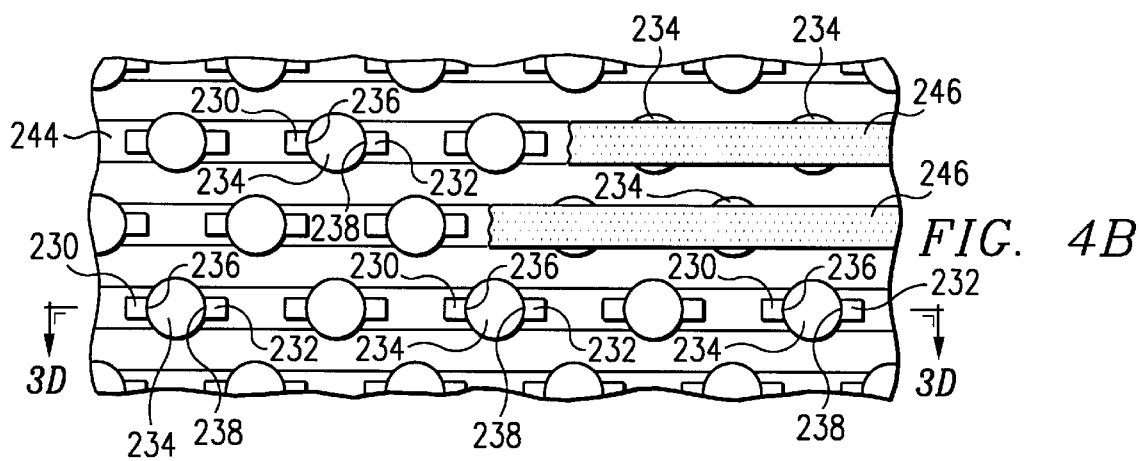

FIG. 4B is a top-plan view illustrating the terminal insulators 244 formed around the first and second terminals 230 and 232. Referring to FIG. 4B, the terminal insulators 244 are formed by conventionally backfilling the surrounding area 224 between the discrete posts 222 and terminals 230 and 232 on the first side 214 of the substrate 212 with an insulative layer. A photolithographic mask 246 is conventionally formed outwardly from the discrete posts 222, the first and second terminals 230 and 232, and the backfill layer. The mask 246 exposes an excess portion of the backfill layer that is conventionally removed to leave the terminal insulators 244. The terminal insulators 244 isolate the terminals 230 and 232 from the surrounding area 224 on the first side 214 of the substrate 212 while leaving a portion of the access channels 234 exposed to the surrounding area 224 for biasing of the channels 234. The excess portion of the backfill layer is conventionally removed by an anisotropic etch, other suitable etch, or other suitable series of etches capable of selectively removing exposed portions of the backfill layer from the underlying substrate 212. After the etch process, the mask 246 is conventionally removed.

Figure 3E:
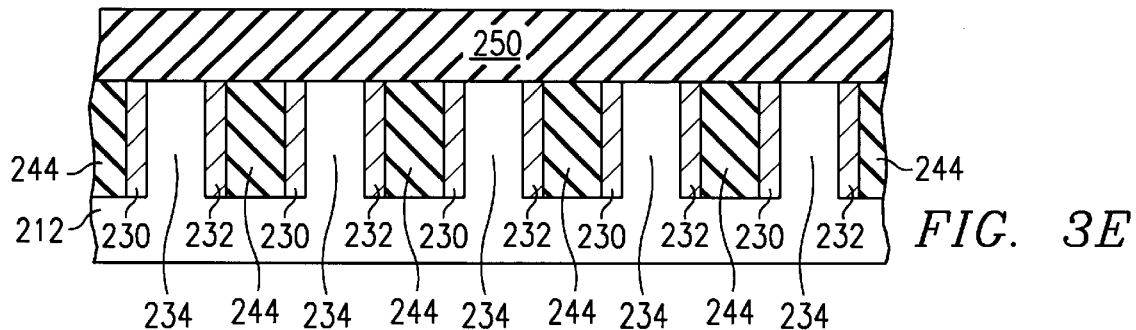
Figure 3F:
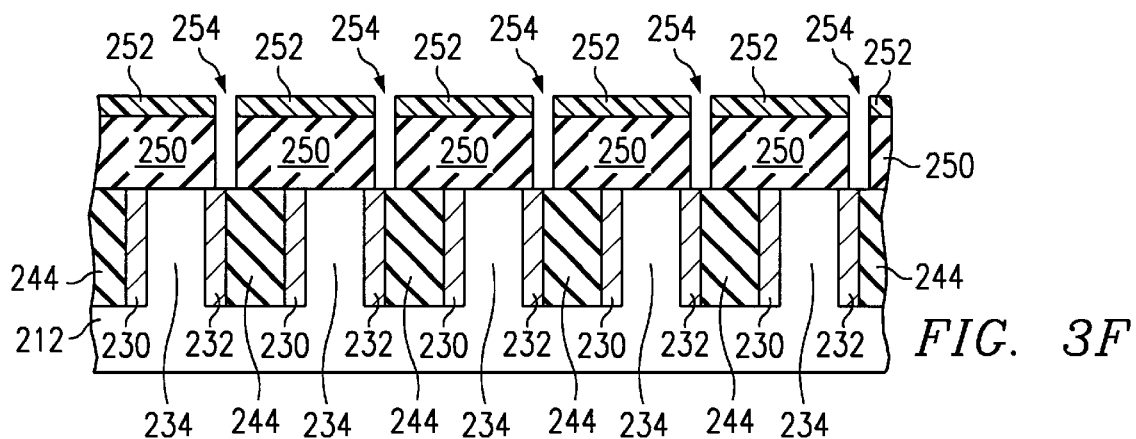
Figure 3G:
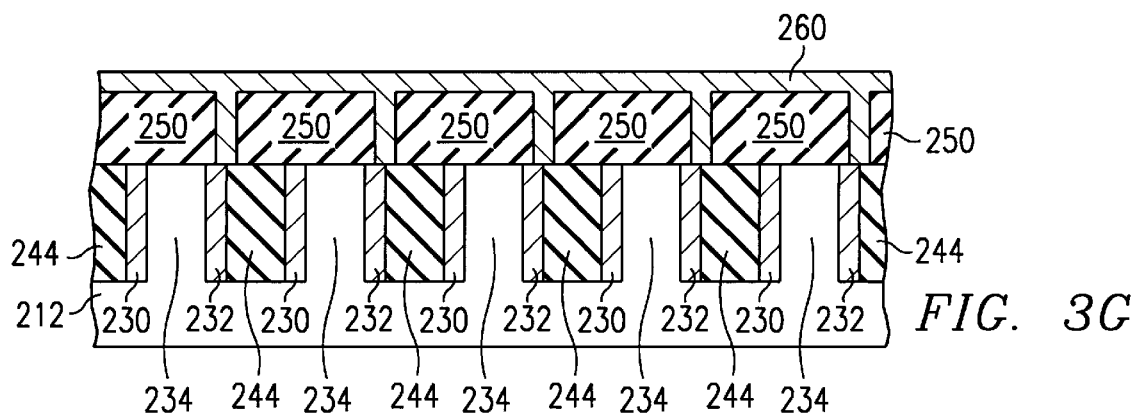
Figure 3H:
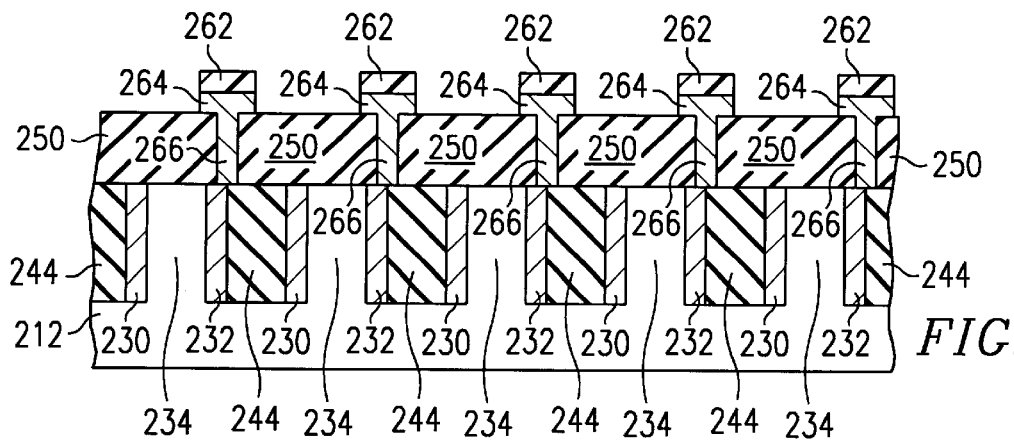
Figure 3I:
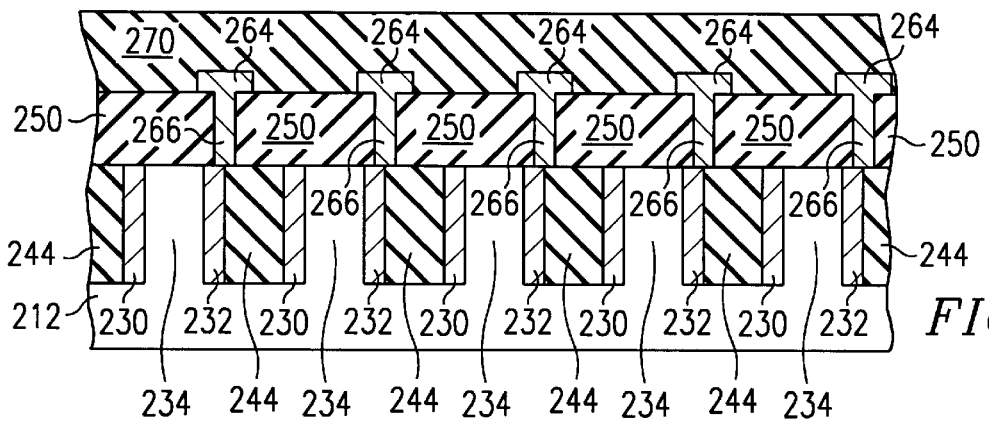
Figure 3J:
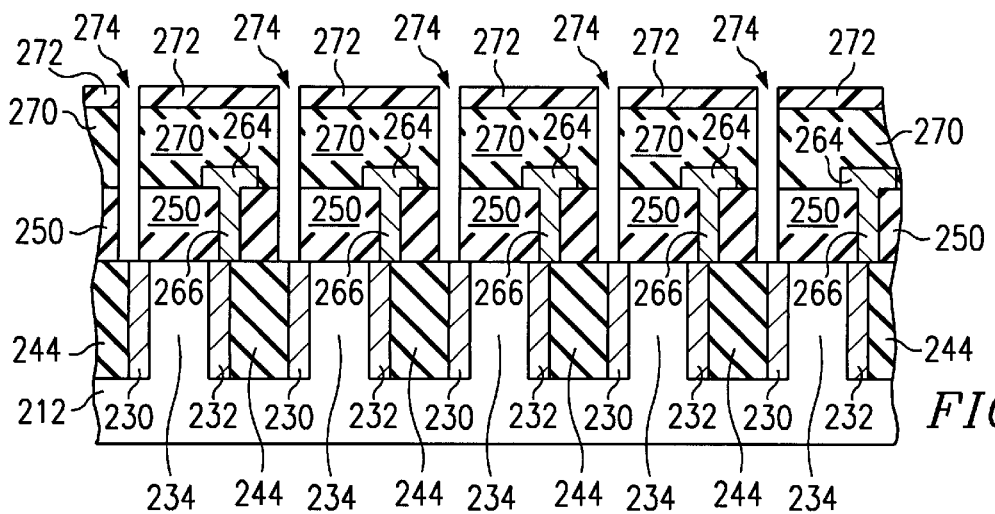
Figure 3K:
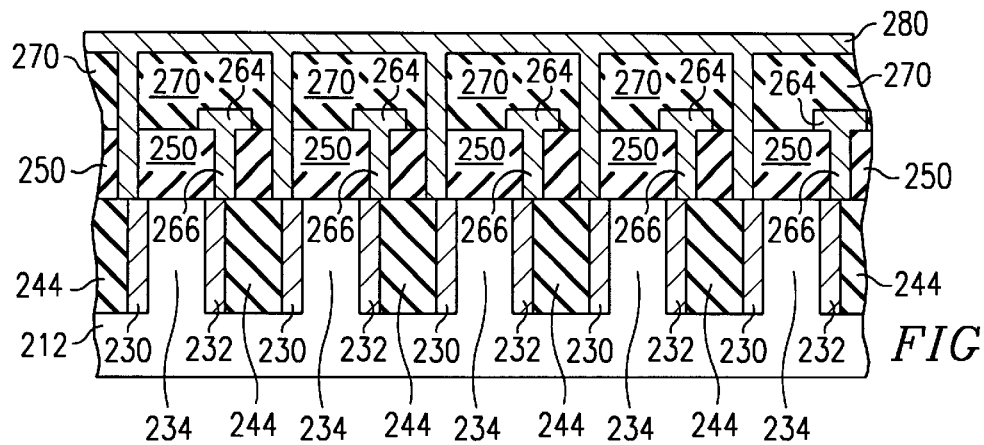
Figure 3L:
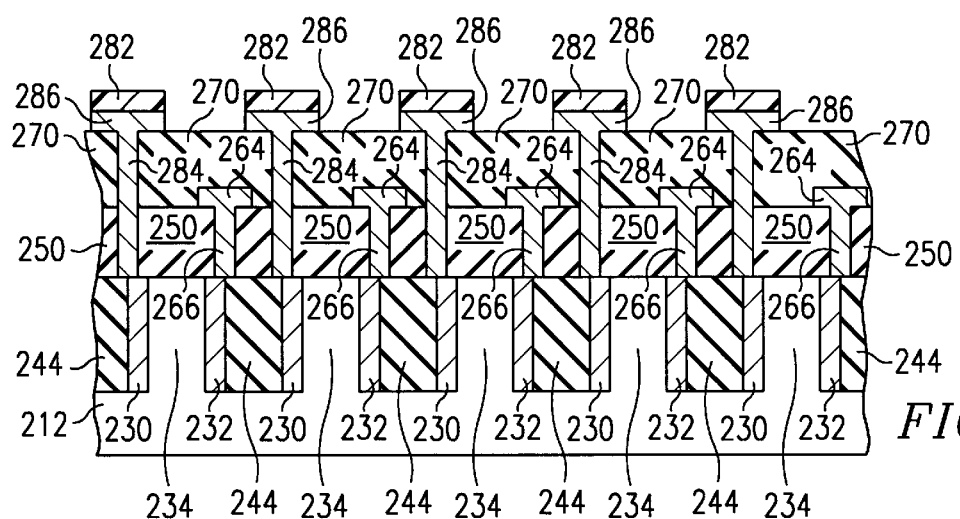
Figure 3M:
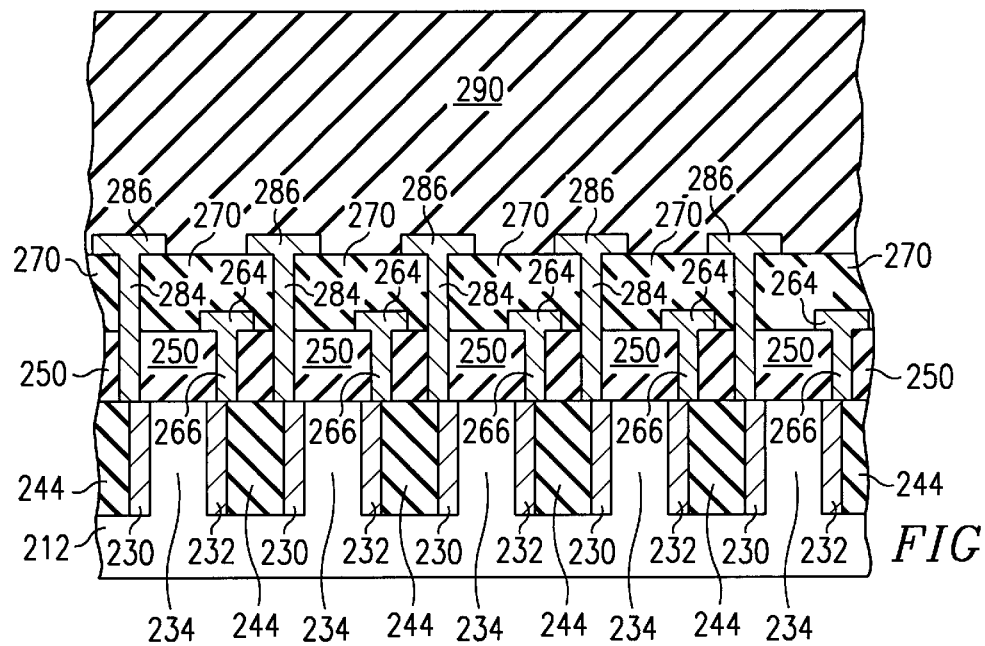
Figure 3N:
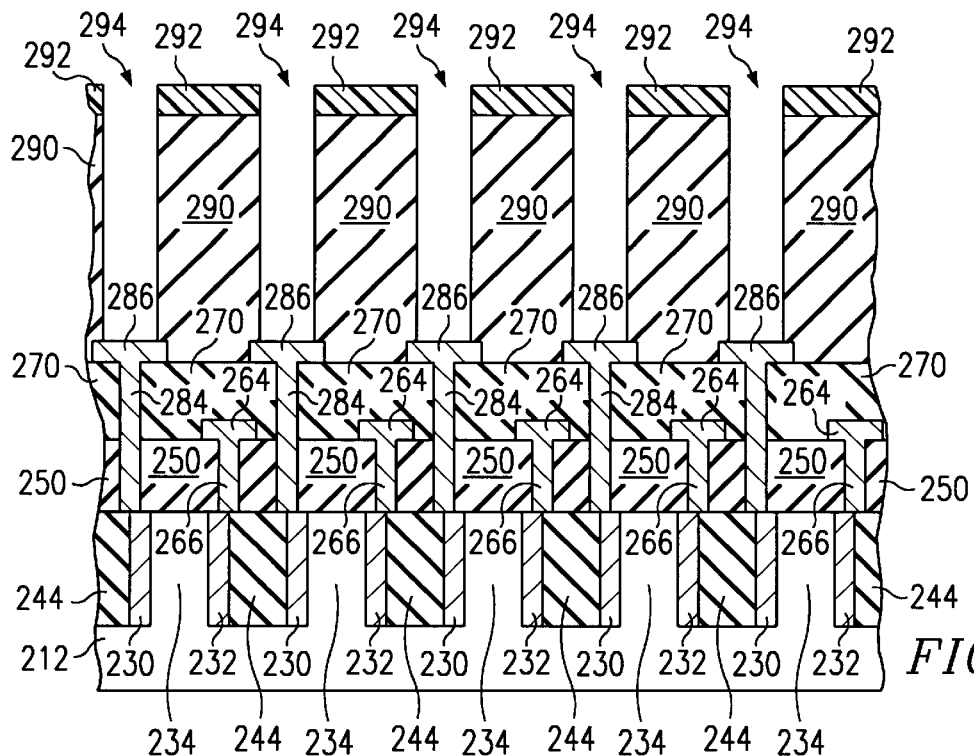
Figure 3O:
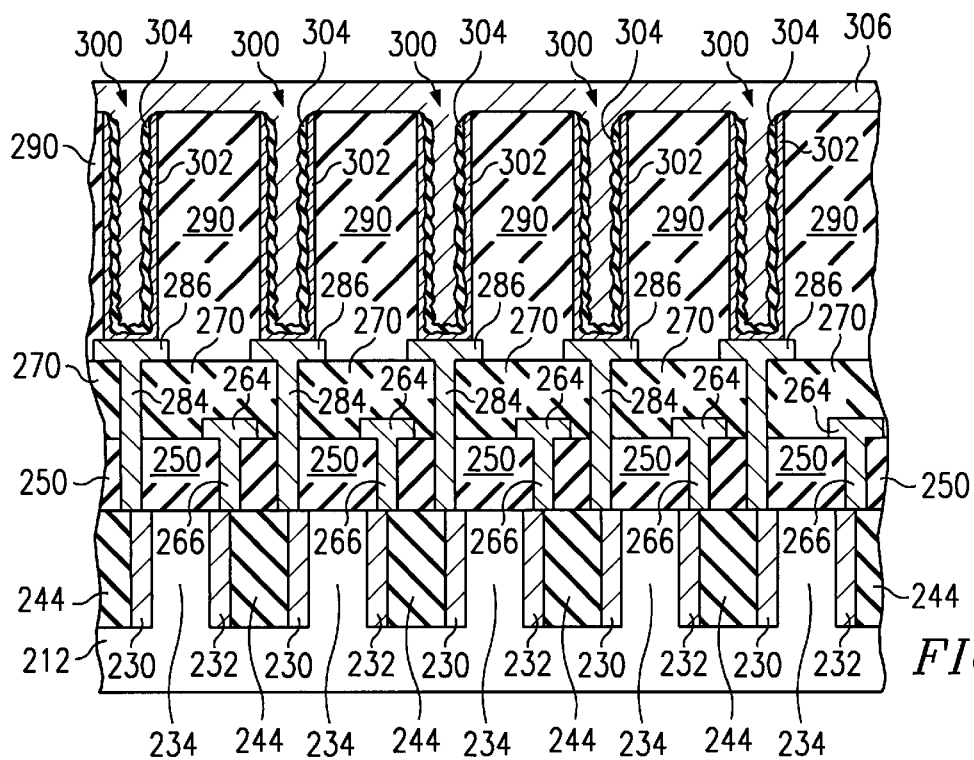
Figure 3S:
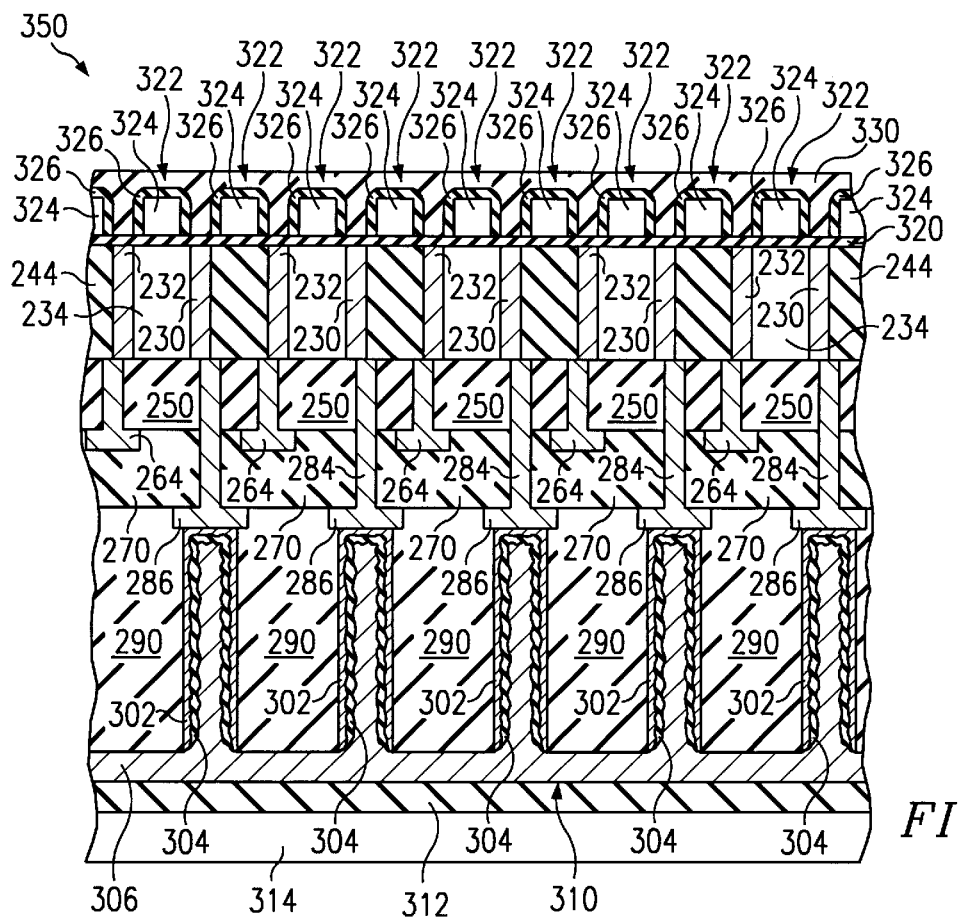
Figure 4C:
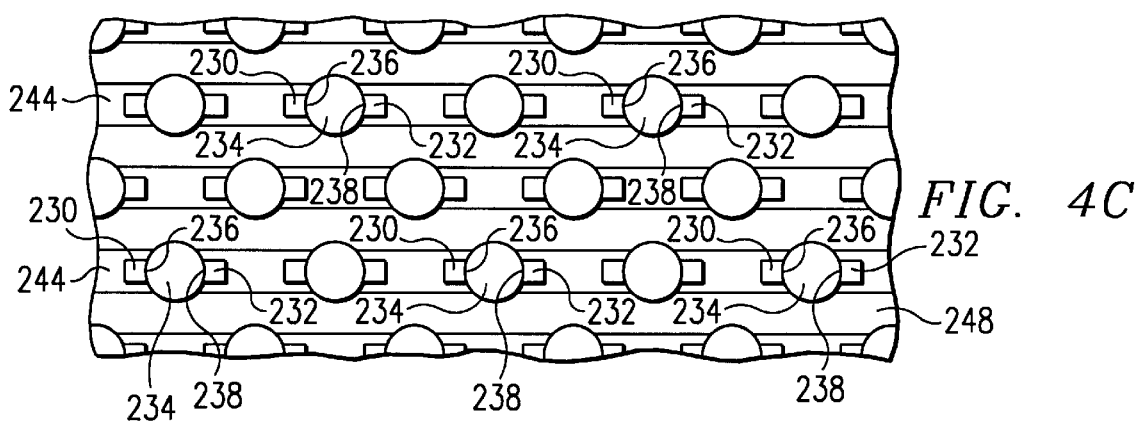

FIG. 4C is a top-plan view illustrating a bias layer 248 formed in the surrounding area 224 between the discrete posts 222 and terminal insulators 244 on the first side 214 of the substrate 212. The bias layer 248 comprises a conductive material capable of coupling the access channels 234 to a biasing system in order to reduce threshold voltage of the gate devices. For the exemplary DRAM embodiment of FIGS. 3 and 4, the bias layer 248 comprises a metal conventionally deposited and planarized to the height of the discrete posts 222. Each section of the bias layer 248 is coupled to the biasing system. In another embodiment, the terminal insulators 244 may be discrete for each terminal 230 and 232. In this embodiment, the bias layer 248 is unitary and need only be connected to the biasing system at a single system.

Referring to FIG. 3E, an insulative layer 250 is formed outwardly from the discrete posts 222, the first and second terminals 230 and 232, and the terminal insulators 244. The insulative layer 250 comprises a dielectric material capable of insulating later formed bit line contacts. For the exemplary DRAM embodiment of FIGS. 3 and 4, the insulative layer comprises a conventionally deposited oxide.

Referring to FIG. 3F, a photolithographic mask 252 is conventionally formed outwardly from the insulative layer 250. The mask 252 is patterned to form bit line contact holes 254 in the insulative layer 250. As described in more detail below, bit line contacts are formed in the contact holes 254. The bit line contacts each connect a second terminal 232 of a gate device with a later formed bit line.

Portions of the insulative layer 250 exposed by the mask 252 are etched through the mask 252 to form the bit line contact holes 254. The contact holes 254 expose the second terminals 232 adjacent the discrete posts 222. The etch is a conventional anisotropic etch, other suitable etch, or other suitable series of etches capable of selectively removing the exposed material of the insulative layer 250 from the second terminals 232. After the etch process, the mask 252 is conventionally removed from the insulative layer 250.

Referring to FIG. 3G, a bit line layer 260 is formed outwardly from the insulative layer 250 and in the contact holes 254. The bit line layer 260 comprises a conductive material capable of forming bit lines. For the exemplary DRAM embodiment of FIGS. 3 and 4, the bit line layer 260 comprises a conventionally deposited metal.

Referring to FIG. 3H, a photolithographic mask 262 is conventionally formed outwardly from the bit line layer 260. The mask 262 is patterned to form a series of bit lines 264 from the bit line layer 260. As described in more detail below, the bit lines 264 each include a plurality of bit line contacts 266 coupled to the second terminals 232 of the gate devices.

Portions of the bit line layer 260 exposed by the mask 262 are etched through the mask 262 to form the bit lines 264. The etch is a conventional anisotropic etch, other suitable etch, or other suitable series of etches capable of selectively removing the exposed material of the bit line layer 260 from the insulative layer 250. After the etch process, the mask 262 is conventionally removed from the bit lines 264.

Figure 4D:
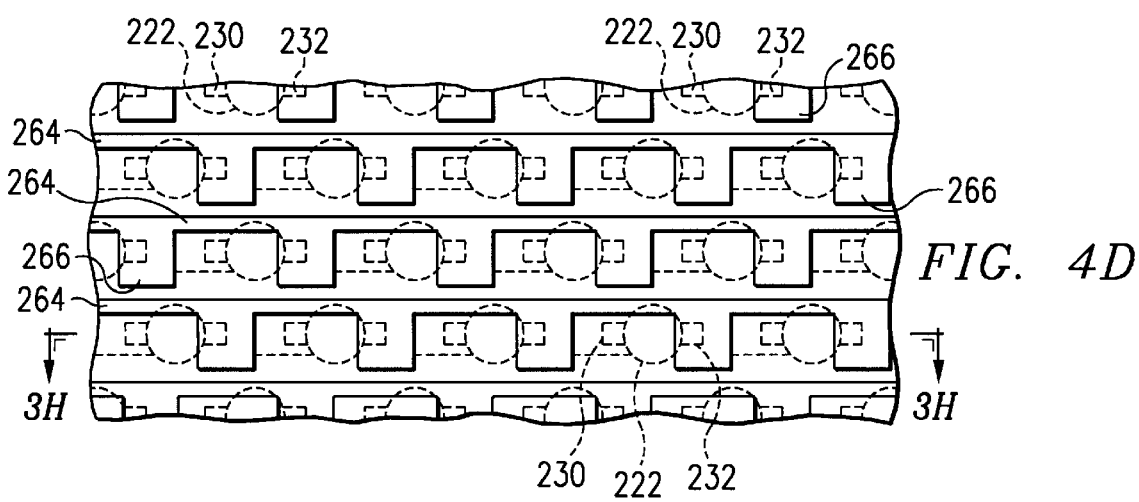

FIG. 4D is a top-plan view illustrating the bit lines 264. Referring to FIG. 4D, the bit lines 264 extend above and to the side of the discrete posts 222 with the bit line contacts 266 extending over and down to the second terminals 232 of the gate devices. Accordingly, the first terminals 230 of the gate devices may be later exposed and connected to storage nodes on the first side 214 of the substrate 212.

The bit lines 264 couple a plurality of memory cells to a sensing circuit for reading accessed information. The bit lines 264 may be terminated on an oxide plug at the periphery of the sub-array for easy access from the second side 216 of the substrate 212.

Referring to FIG. 3I, an insulative layer 270 is formed outwardly from the insulative layer 250 and the bit lines 264. The insulative layer 270 comprises a dielectric material capable of insulating the bit lines 264 from later formed elements of the DRAM. For the exemplary DRAM embodiment of FIGS. 3 and 4, the insulative layer 270 comprises a conventionally deposited oxide.

Referring to FIG. 3J, a photolithographic mask 272 is conventionally formed outwardly from the insulative layer 270. The mask 272 is patterned to form storage node contact holes 274 in the insulative layer 270. As described in more detail below, storage node contacts are formed in the contact holes 274. The storage node contacts each connect a first terminal 230 of a gate device with a later formed storage node for a memory cell.

Portions of the insulative layer 270 exposed by the mask 272 are etched through the mask 272 to form the storage node contact holes 274. The contact holes 274 expose the first terminals 230 of the gate devices. The etch is a conventional anisotropic etch, other suitable etch, or other suitable series of etches capable of selectively removing the exposed material of the insulative layer 270 from the first terminals 230. After the etch process, the mask 272 is conventionally removed from the insulative layer 270.

Referring to FIG. 3K, a contact layer 280 is formed outwardly from the insulative layer 270 and in the contact holes 274. The contact layer 280 comprises a conductive material capable of connecting the first terminal 230 of each gate device with a later formed storage node. For the exemplary DRAM embodiment of FIGS. 3 and 4, the contact layer 280 comprises a conventionally deposited metal.

Referring to FIG. 3L, a photolithographic mask 282 is conventionally formed outwardly from the contact layer 280. The mask 282 is patterned to form storage node contacts 284 from the contact layer 280. The storage node contacts 284 each connect to a first terminal 230 and extend through an overlying contact hole 274 to provide an enlarged contact area 286 for a later formed storage node.

Portions of the contact layer 280 exposed by the mask 282 are etched through the mask 282 to form the storage node contacts 284. The etch is a conventional anisotropic etch, other suitable etch, or other suitable series of etches capable of selectively removing the exposed material of the contact layer 280 from the insulative layer 270. After the etch process, the mask 282 is conventionally removed from the contacts 284.

Referring to FIG. 3M, a storage node layer 290 is formed outwardly from the insulative layer 270 and the storage node contacts 284. As described in more detail below, the storage nodes are formed within the storage node layer 290. The storage node layer 290 comprises a dielectric material capable of insulating the later formed storage nodes from each other. The thickness of the storage node layer 290 is varied based on the desired height and thus the capacitance of the storage nodes. For the exemplary DRAM embodiment of FIGS. 3 and 4, the storage node layer 290 comprises conventionally deposited oxide.

Referring to FIG. 3N, a photolithographic mask 292 is conventionally formed outwardly from the storage node layer 290. The mask 292 is patterned to form storage node holes 294 in the storage node layer 290. As described in more detail below, storage nodes for the memory cells are formed in the storage node holes 294. The storage nodes each store information for a memory cell.

Portions of the storage node layer 290 exposed by the mask 292 are etched through the mask 292 to form the storage node holes 294. The storage node holes 294 expose the storage node contacts 284. The etch is a conventional anisotropic etch, other suitable etch, or other suitable series of etches capable of selectively removing the exposed material of the storage node layer 290 from the storage node contacts 284. The storage node contacts 284 preferably act as an etch stop to the deep etch of the storage node layer 290. After the etch process, the mask 292 is conventionally removed from the storage node layer 290.

Referring to FIG. 3O, a storage node 300 is formed in a storage node hole 294 for each memory cell. For the exemplary DRAM embodiment of FIGS. 3 and 4, the storage node 300 is a stacked capacitor having a bottom electrode 302, a capacitor dielectric 304, and a top electrode 306. The bottom electrode 302 comprises a doped polysilicon layer conventionally deposited in the storage node holes 294. The doped polysilicon layer is conventionally ruggedized to increase the surface area between the first and second electrodes 302 and 306. The capacitor dielectric 304 comprises a nitride and oxide dielectric layer conventionally deposited outwardly from the bottom electrodes 302. The top electrode 306 is a field plate. The field plate comprises doped polysilicon deposited to fill the remaining portion of the storage node holes 294 and between the storage nodes 300. The plate material may be terminated on an oxide plug at the periphery of the sub-array for easy access from the second side 216 of the substrate 212.

Referring to FIG. 3P, the first portion 310 of the sub-array, including the first and second terminals 230 and 232, access channels 234, and storage nodes 300 for each memory cell of the sub-array, is isolated by an insulative layer 312. The insulative layer 312 comprises a dielectric material capable of insulating the first portion of the sub-array from other sub-arrays and elements of the DRAM. For the exemplary DRAM embodiment of FIGS. 3 and 4, the insulative layer 312 comprises a conventionally deposited oxide.

A support structure 314 is mounted to the insulative layer 312 on the first side 214 of the substrate 212 to provide support for the substrate 212. The support structure 314 encapsulates the first portion 310 of the sub-array to protect the bit lines 264 and the storage nodes 300. In one embodiment, the support structure 314 comprises a conductor to allow connections between the sub-arrays and to act as a heat sink for the first portion of the DRAM.

Referring to FIG. 3Q, the substrate 212 is flipped to expose the second side 216 of the substrate 212 for processing. Because of the additional support provided by the support structure 314, an excess portion of the second side 216 of the substrate 212 may be removed without damaging or unacceptably weakening the substrate 212 or DRAM.

Referring to FIG. 3R, the second side 216 of the substrate 212 is planarized to expose the first and second terminals 230 and 232 adjacent to the discrete posts 222 and the access channels 234 in the discrete posts 222. The second side 216 of the substrate 212 may be conventionally planarized by a chemical mechanical polish (CMP), etch back, or other suitable process. The planarization is carefully controlled to ensure that the excess portion of the substrate 212 is removed without removing or damaging the discrete posts 222. Referring to FIG. 3S, a gate dielectric layer 320 is formed outwardly from the first and second terminals 230 and 232 and access channels 234 on the second side 216 of the substrate 212. A series of gate structures 322 are formed outwardly from the dielectric layer 320. The gate structures 322 are each operable to control an underlying access channel 234 to selectively couple the first terminal 230 to the second terminal 232 to allow access to the storage node 300. The gate structures 322 may each be disposed over an access channel 234 between the first and second terminals 230 and 232 or otherwise suitably disposed. For example, the gate structures 322 may be disposed over the first and second terminals 230 and 232 in addition to the access channel 234.

Each gate structure 322 together with the associated access channel 234 and first and second terminals 230 and 232 form a gate device for a memory cell. For the exemplary DRAM embodiment of FIGS. 3 and 4, the gate devices are MOSFET devices and the gate structures are conventionally formed word lines comprising a gate 324 and a sidewall insulator 326. The memory cells may have a design rule as previously described in connection with the DRAM of FIGS. 1 and 2.

In operation, information in the memory cells is accessed using the word lines to couple the bit lines to the storage nodes and the bit lines to relay the stored information to the sensing circuit. The word lines and bit lines are controlled by conventional addressing logic. Additional contacts may be formed between the first and second portions of the sub-array and periphery circuit devices may be formed between the sub-arrays of the DRAM using the word line fabrication steps or other suitable processes as previously described in connection with FIGS. 1 and 2.

An insulative layer 330 is formed outwardly from the gate dielectric layer 320 and the gate structures 322 to complete the second portion 350 of the sub-array for the DRAM. The insulative layer 330 comprises a dielectric material capable of insulating and protecting the gate structures 322 from later formed elements of the DRAM. For the exemplary DRAM embodiment of FIGS. 3 and 4, the insulative layer 330 comprises a conventionally deposited oxide. Because the storage nodes 300 and the bit lines 264 are formed on the first 214, or backside, of the substrate 212, topology is minimized on the top side of the DRAM. In addition, the height of the storage nodes 300 may be increased without causing topological problems on the top side in the memory array. Storage node materials that would otherwise conflict with other components of the memory array may also be used. Accordingly, storage node capacitance is increased without increasing fabrication costs. In addition, taller and less complex storage node configurations may be used that reduce the cost and increase yield.

FIGS. 5 and 6 illustrate fabrication of a memory array in accordance with still another embodiment of the present invention. For the embodiment of FIGS. 5 and 6, the memory array is also a high-density dynamic random access memory (DRAM) having tight pitch memory cells. Each memory cell includes a storage node, a gate device to control access to the storage node, and a bit line to access the storage node. The memory cells, storage nodes, gate devices, and method of this embodiment of the present invention may also be used in connection with other suitable types of memory cells, memory arrays, and electronic circuits.

Referring to FIG. 5A, an initial DRAM structure 410 includes a substrate 412 having a first side 414 and a second, opposite side 416. The substrate 412 may be a semiconductive or insulative wafer, an epitaxial or other layer formed on a wafer or other underlying structure, a semiconductor on insulator (SOI) system, and the like. As described in more detail below, a first portion of the DRAM is formed on the first side 414 of the substrate 412 while a second portion of the DRAM is formed on the second side 416 of the substrate 412. As a result, topology of the DRAM is improved, which reduces process complexity and cost while increasing yield.

The DRAM is formed from a plurality of sub-arrays. The first portion of the sub-arrays are fabricated on the first side 414 of the substrate 412. The second portion of each sub-array is fabricated on the second side 416 of the substrate 412 opposite the first portion of the sub-array. For a 64 megabyte DRAM, the substrate 412 includes sixteen (16) sub-arrays each having four (4) megabytes of memory. The sub-arrays may use a conventional layout scheme to allow bit line compare.

Referring to FIG. 5B, an exemplary portion of the substrate 412 is illustrated to describe fabrication of a first portion of a sub-array for the DRAM. Other first portions of other sub-arrays for the DRAM are similarly fabricated using the same process steps. A photolithographic mask 420 is conventionally formed outwardly from the first side 414 of the substrate 412. The mask 420 is patterned to form a plurality of elongated projections 422 on the first side 414 of the substrate 412. The projections 422 are elongated in that each projection 422 includes access channels for a plurality of gate devices. The elongated projections 422 each protrude from a surrounding area 424 of the first side 414 of the substrate 412. The access channels comprise semiconductor or other suitable material that is operable to be controlled by a later formed gate structure to selectively couple different elements of the gate device to each other to allow access to the memory cell. The elongated projections 422 may be formed directly from the substrate 412, from one or more intermediate layers disposed between the mask 420 and the substrate 412, or a combination of the substrate 412 and one or more intermediate layers.

For the embodiment of FIG. 5B, the mask 420 is formed directly on the first side 414 of the substrate 412. Portions of the substrate 412 exposed by the mask 420 are etched through the mask 420 to form the elongated projections 422 from the substrate 412. In this embodiment, the substrate 412 comprises slightly doped silicon or other suitable semiconductor material. The etch is a conventional anisotropic etch, other suitable etch, or other suitable series of etches capable of selectively removing a portion of the exposed substrate 412. After the etch process, the mask 420 is conventionally removed from the elongated projections 422.

Figure 5C:
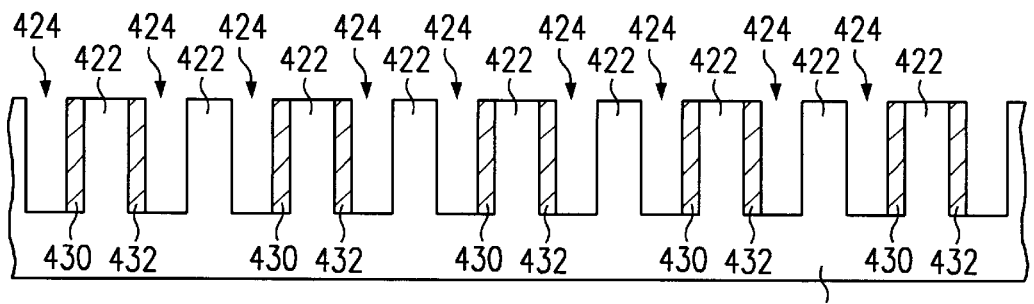
FIGS. 5A–S are a series of schematic cross-sectional diagrams illustrating fabrication of a memory array in accordance with still another embodiment of the present invention.

Referring to FIG. 5C, a set of first terminals 430 and a set of second terminals 432 are formed adjacent to each elongated projection 422. A plurality of access channels 434 are each defined in the elongated projections 422 between the first and second terminals 430 and 432 which are offset between neighboring projections 422. The access channels 434 each form a path between the first and second terminals 430 and 432 that is operable to be controlled by a later formed gate structure to selectively couple the first terminal 430 to the second terminal 432 to allow access to the memory cell. Together, the later formed gate structure, the first and second terminals 430 and 432, and the access channel 434 form the gate device for the memory cell. The first and second terminals 430 and 432 are a source and a drain or other suitable types of electrodes for the gate device. For the exemplary DRAM embodiment of FIGS. 5 and 6, the gate devices are metal oxide semiconductor field effect transistors (MOSFET).

Figure 6A:
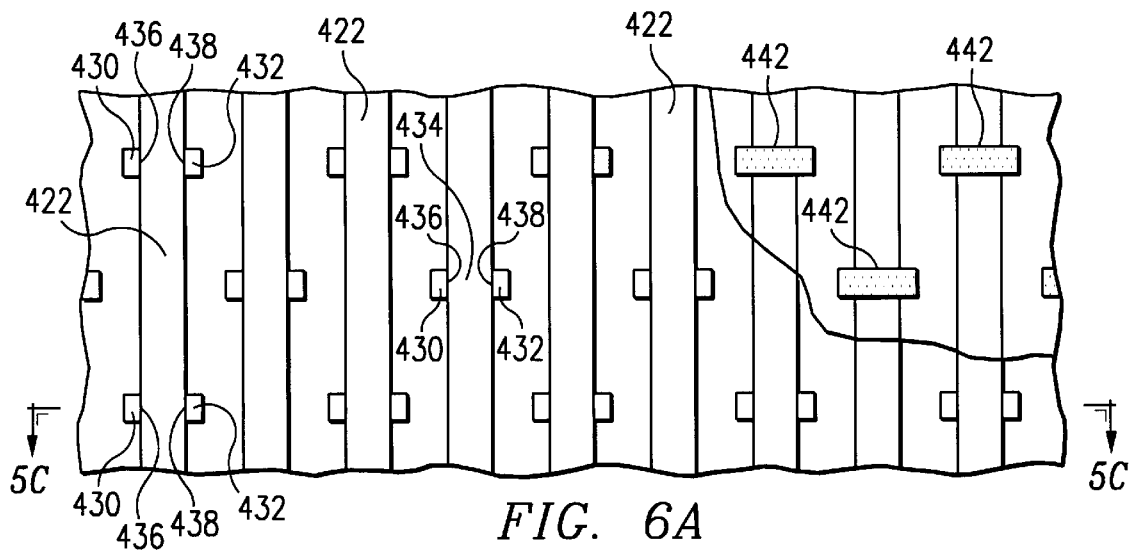
FIGS. 6A–D are a series of top-plan diagrams illustrating the memory array of FIG. 5 at different stages of the fabrication process.

FIG. 6A is a top-plan view illustrating the first and second terminals 430 and 432 formed adjacent to the elongated projections 422. Referring to FIG. 6A, the first terminals 430 are each formed adjacent to a first edge 436 of the elongated projections 422 and the second terminals 432 are each formed adjacent to a second, opposite edge 438 of the elongated projections 422. The access channels 434 are each defined in the elongated projections 422 between the first and second terminals 430 and 432. Accordingly, the gate device has a raised channel with individual source and drain terminals 430 and 432. The individual terminals 430 and 432 allow the gate devices to be scaled down to minimal isolation between devices. Accordingly, very high density DRAM and other memory devices or integrated circuits may be fabricated.

The first and second terminals 430 and 432 are formed adjacent to the elongated projections 422 by conventionally depositing a conductive layer in the surrounding area 424 between the elongated projections 422 on the first side 414 of the substrate 412. A photolithographic mask 442 is conventionally formed outwardly from the discrete posts 422 and the conductive layer. The mask 442 exposes an excess portion of the conductive layer that is removed to leave first terminals 430 adjacent to the first edges 436 of the elongated projections 422 and the second terminals 432 adjacent to the second edges 438 of the elongated projections 422. The excess portion of the conductive layer is removed by a conventional anisotropic etch, other suitable etch, or other suitable series of etches capable of selectively removing the exposed material of the conductive layer from the substrate 412. After the etch process, the mask 442 is conventionally removed from the elongated projections 422 and the first and second terminals 430 and 432. It will be understood that the terminals 430 and 432 may be otherwise formed. For example, the terminals 430 and 432 may be doped in the edges of the elongated projections 422.

The terminals 430 and 432 are preferably a metal or other highly conductive material to minimize device resistance. The use of metal terminals 430 and 432 allows the height of the elongated projections 422 to be increased without unacceptably increasing resistance in the first and second terminals 430 and 432. Accordingly, metal terminals 430 and 432 may be preferred in applications with high elongated projections 422, high planarization tolerances, and the like.

Figure 5D:
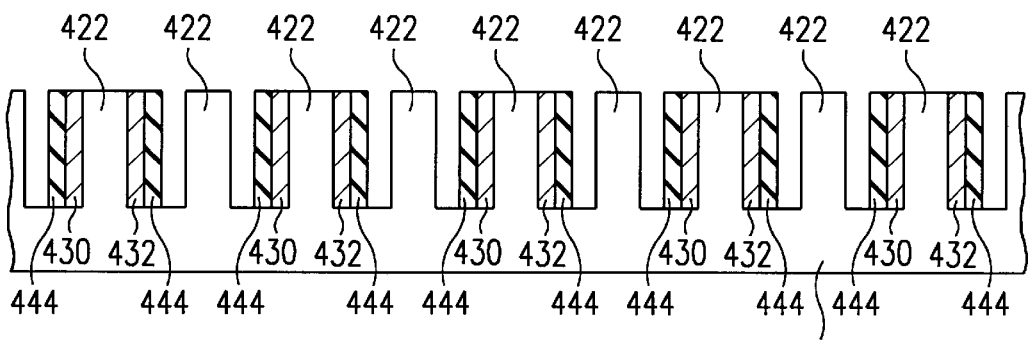

Referring to FIG. 5D, terminal insulators 444 are formed around the exposed sides of the first and second terminals 430 and 432. The terminal insulators 444 insulate the terminals 430 and 432 from a later formed bias layer. The terminal insulators 444 comprise oxide or other suitable dielectric material.

Figure 6B:
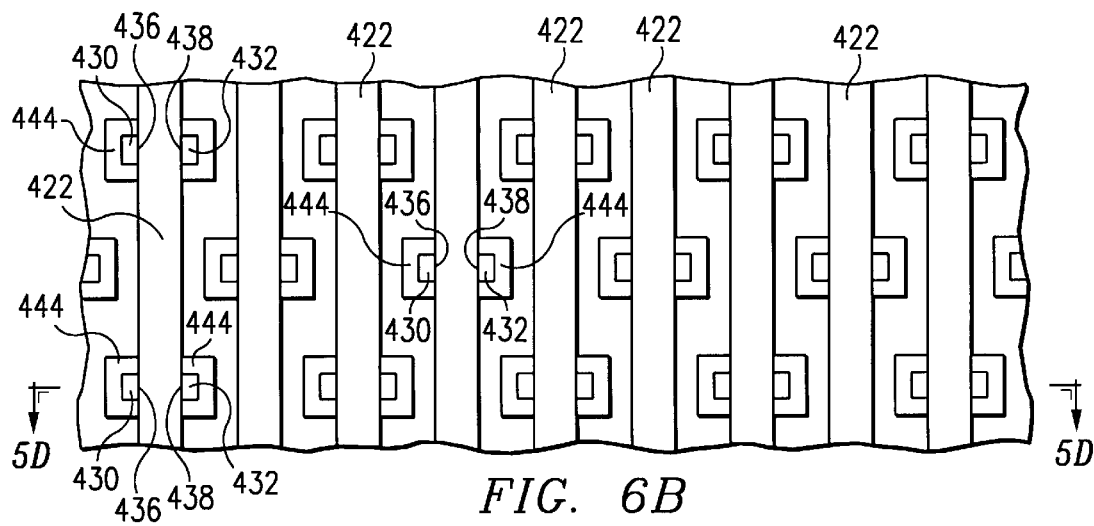

FIG. 6B is a top-plan view illustrating the terminal insulators 444 formed around the first and second terminals 430 and 432. Referring to FIG. 6B, the terminal insulators 444 are formed by conventionally backfilling the surrounding area 424 between the elongated projections 422 and terminals 430 and 432 on the first side 414 of the substrate 412 with an insulative layer. A photolithographic mask 446 is conventionally formed outwardly from the elongated projections 422, the first and second terminals 430 and 432, and the backfill layer. The mask 446 exposes an excess portion of the backfill layer that is conventionally removed to leave the terminal insulators 444. The terminal insulators 444 isolate the terminals 430 and 432 from the surrounding area 424 on the first side 414 of the substrate 412 while leaving a portion of the elongated projections 422 exposed to the surrounding area 424 for biasing of the access channels 434. The excess portion of the backfill layer is conventionally removed by an anisotropic etch, other suitable etch, or other suitable series of etches capable of selectively removing exposed portions of the backfill layer from the underlying substrate 412. After the etch process, the mask 446 is conventionally removed.

Figure 5E:
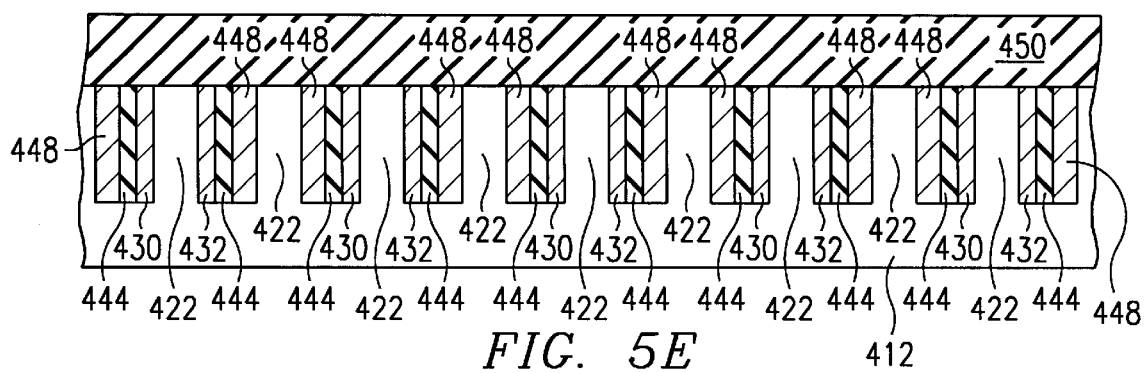
Figure 5F:
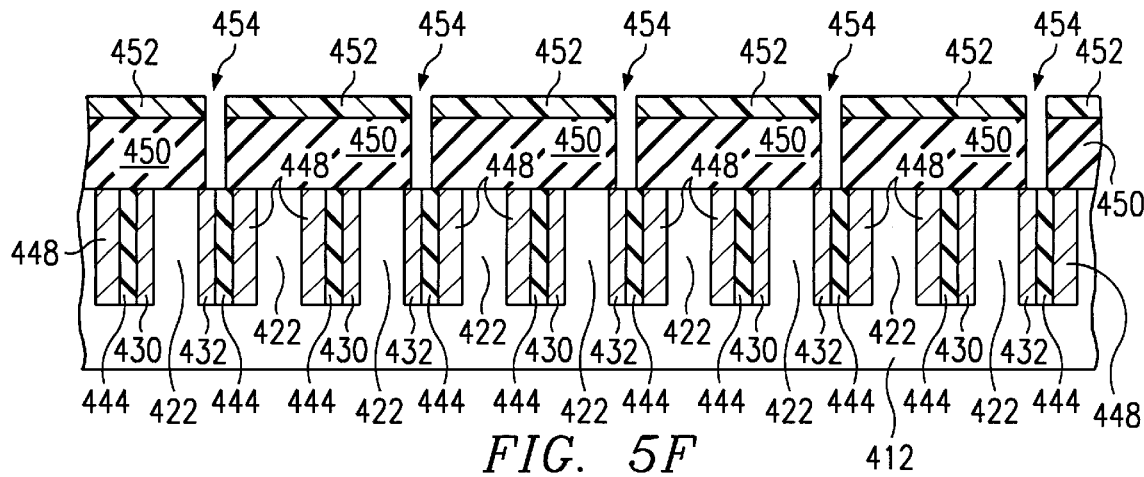
Figure 5G:
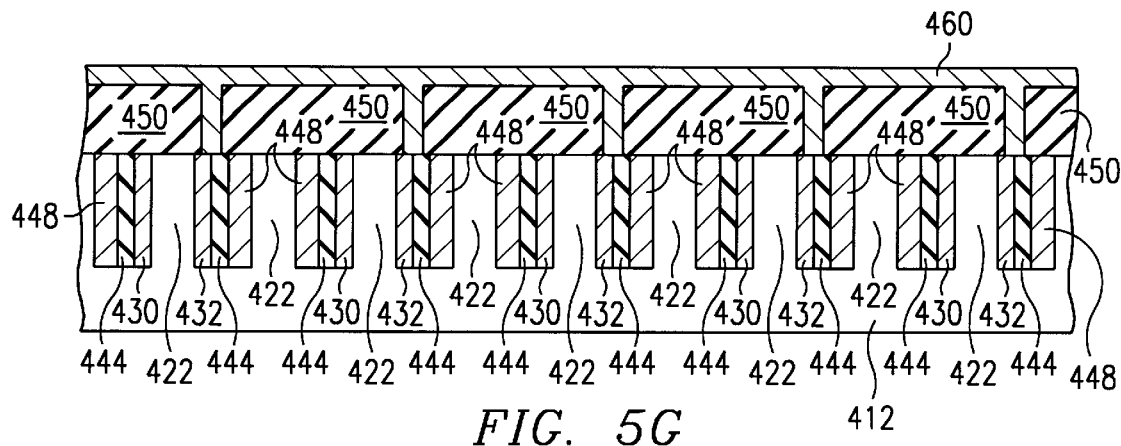
Figure 5H:
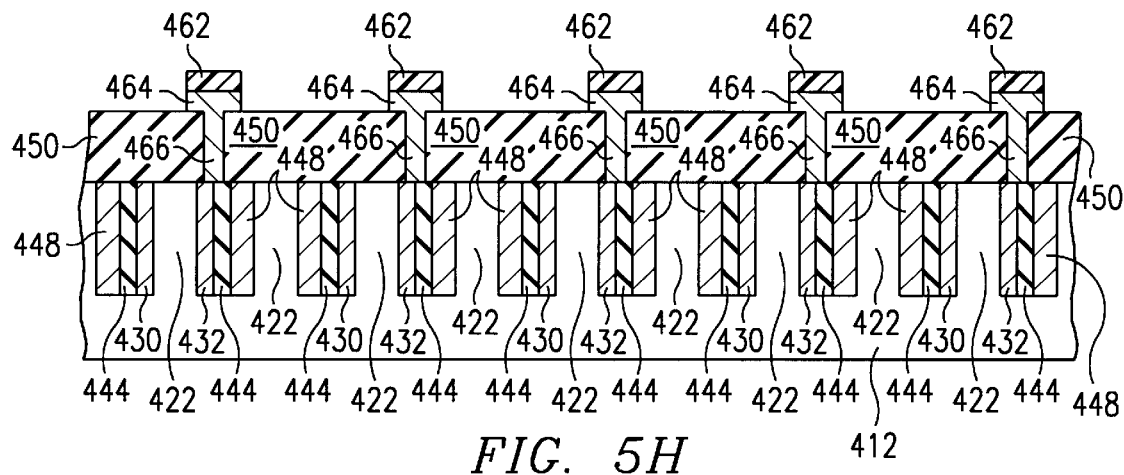
Figure 5I:
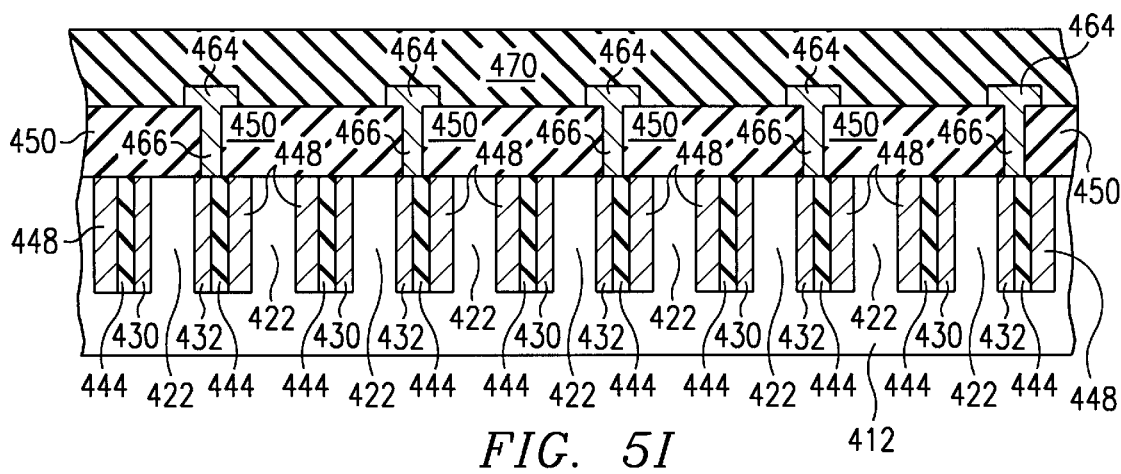
Figure 5J:
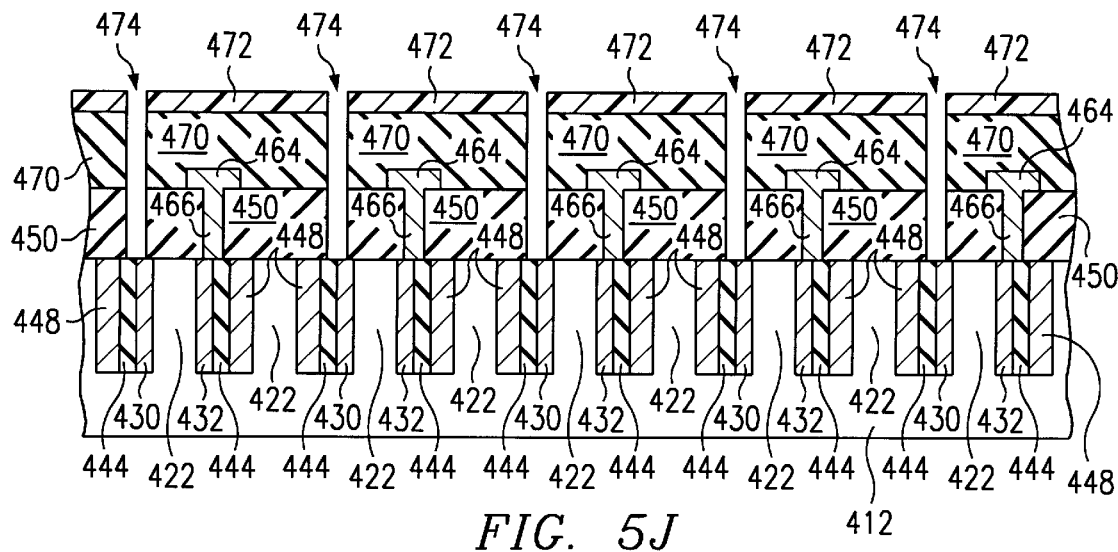
Figure 5K:
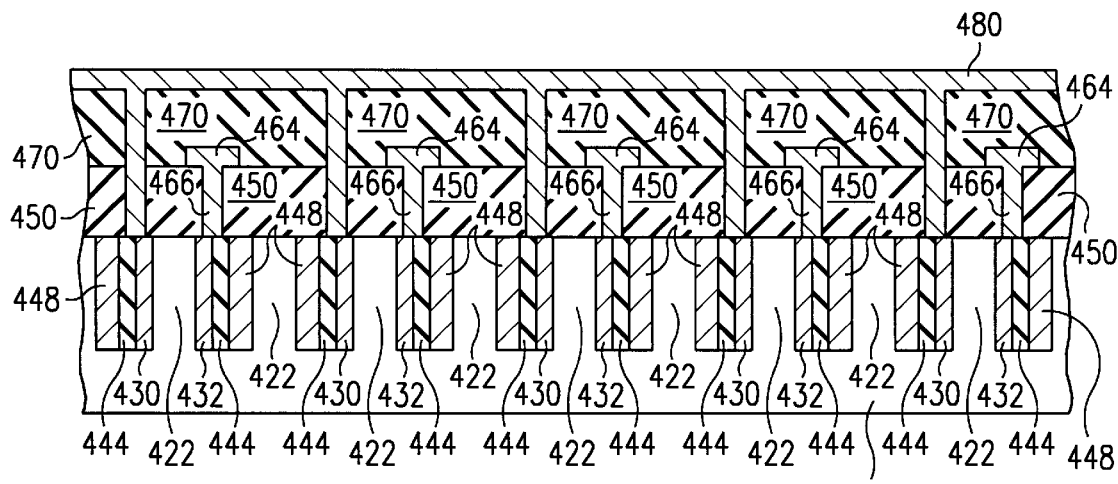
Figure 5L:
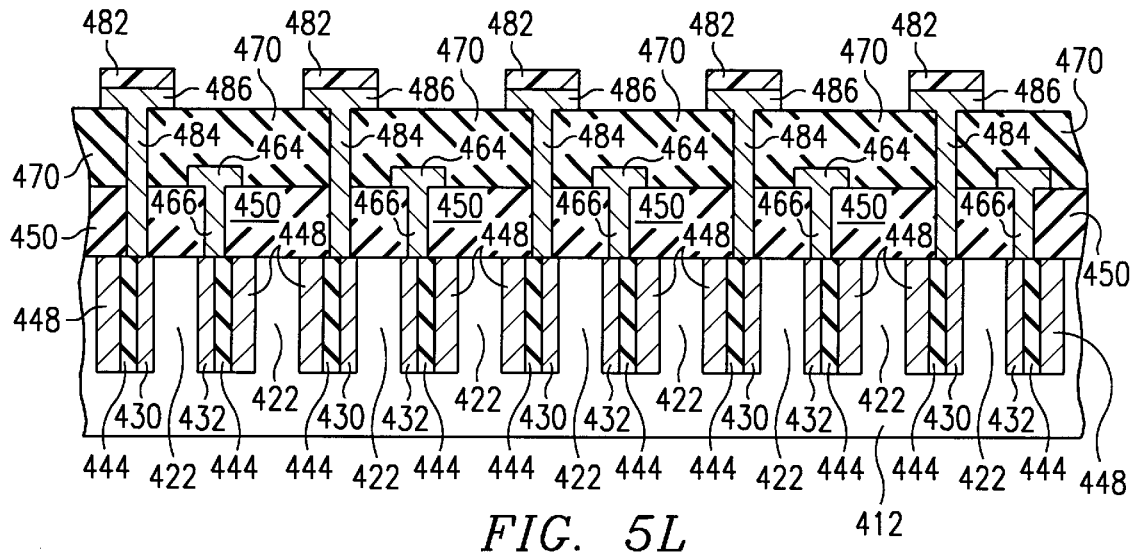
Figure 5M:
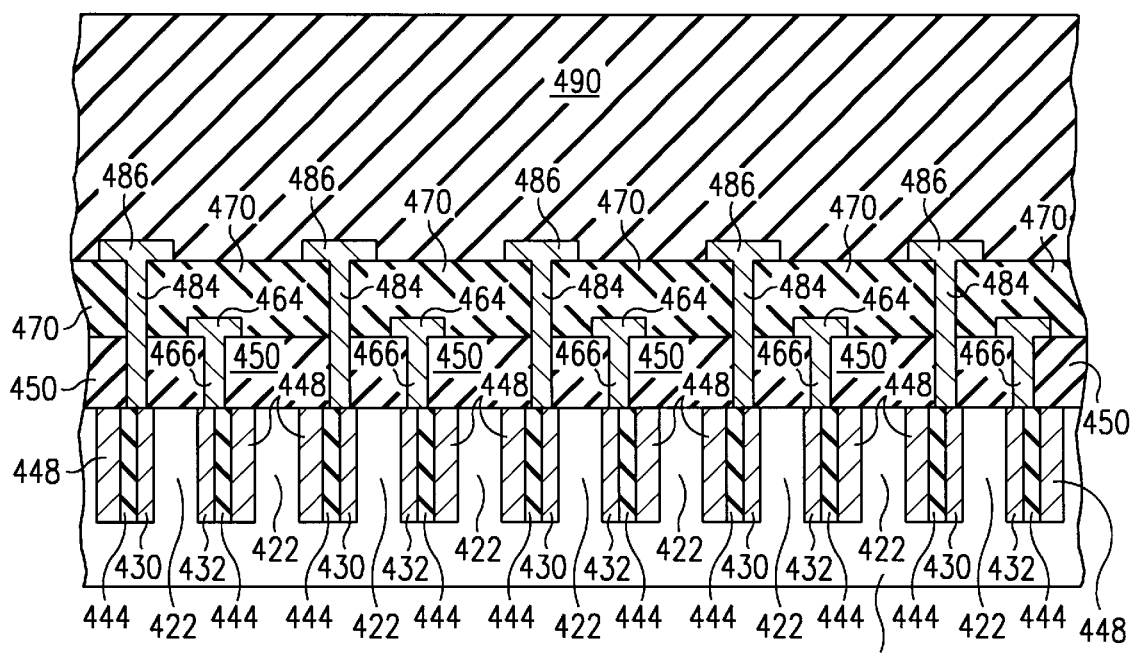
Figure 5N:
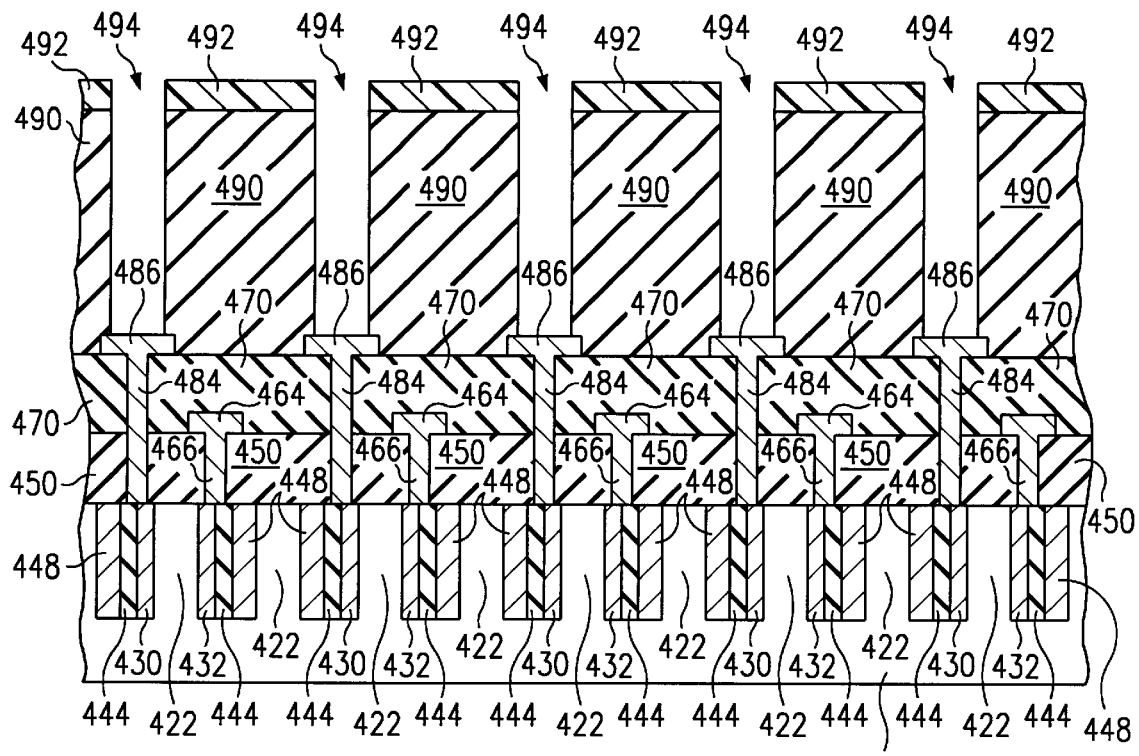
Figure 5O:
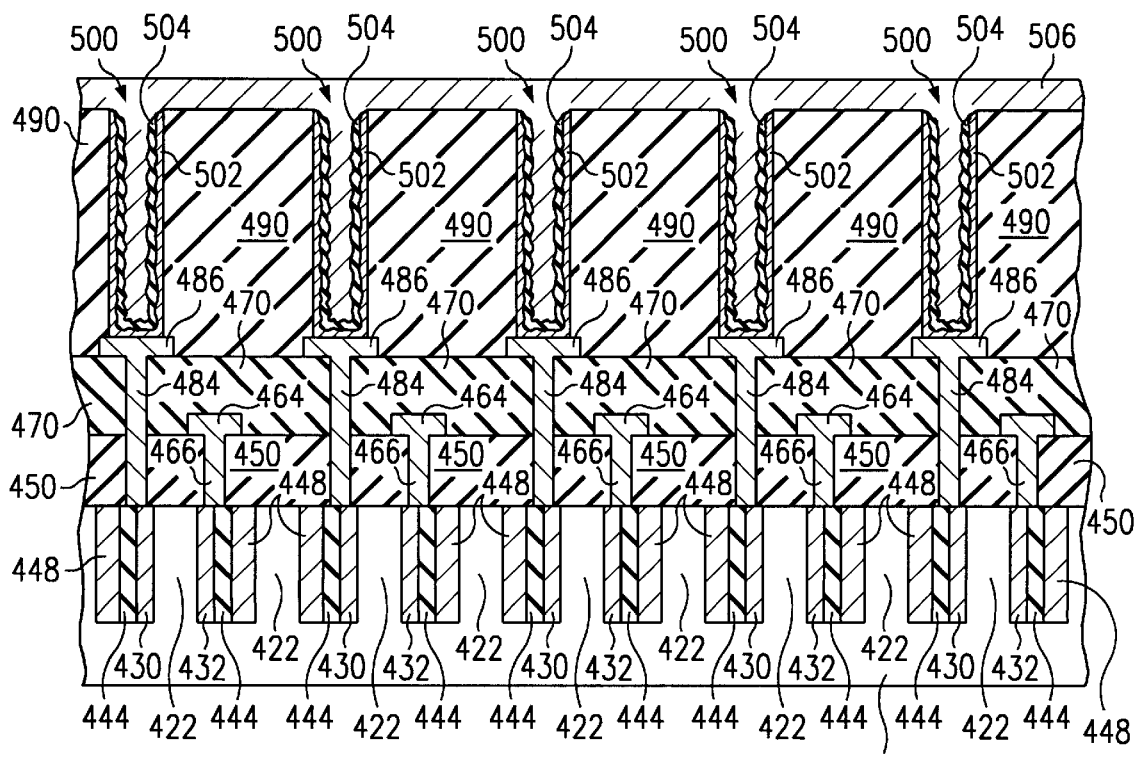
Figure 5P:
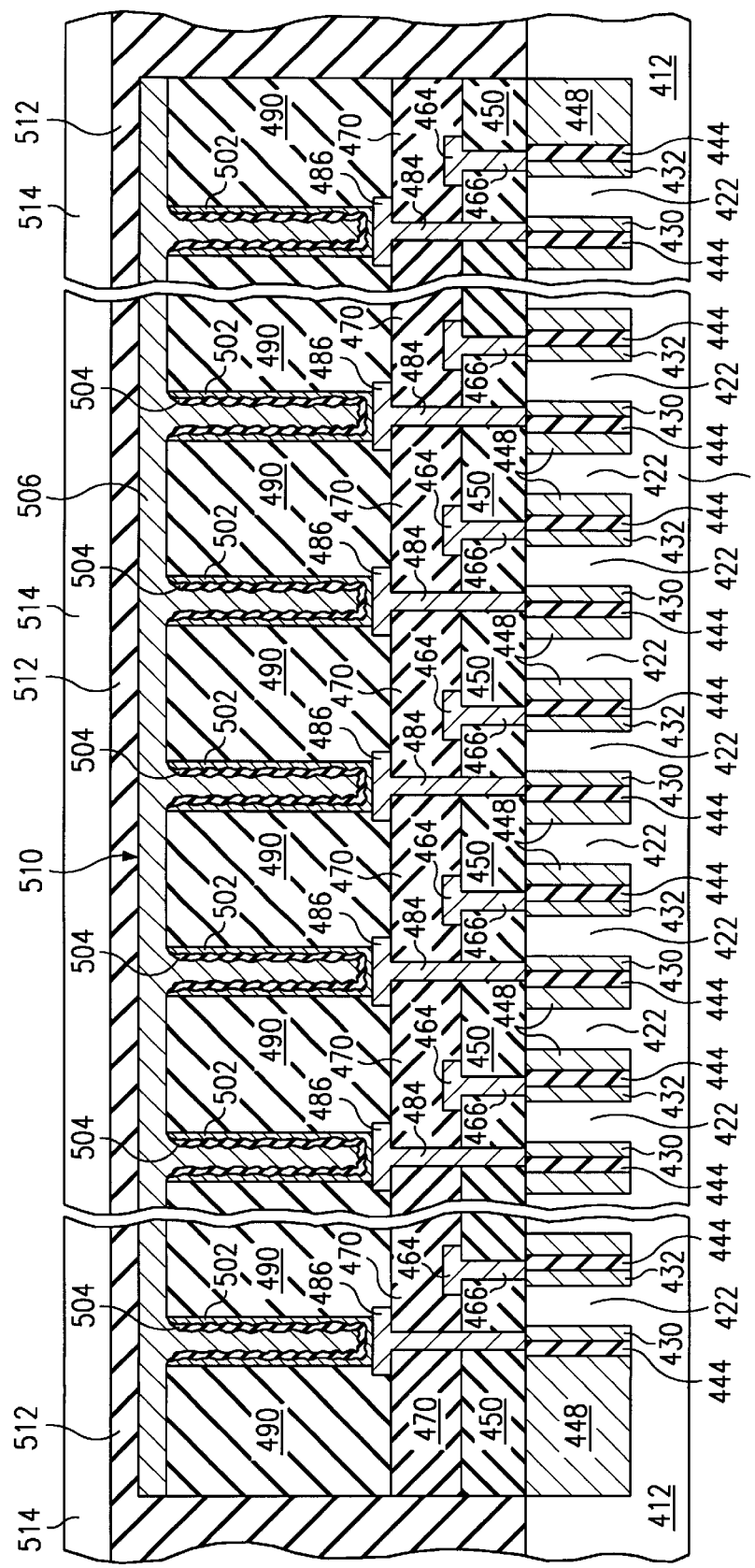
Figure 5S:
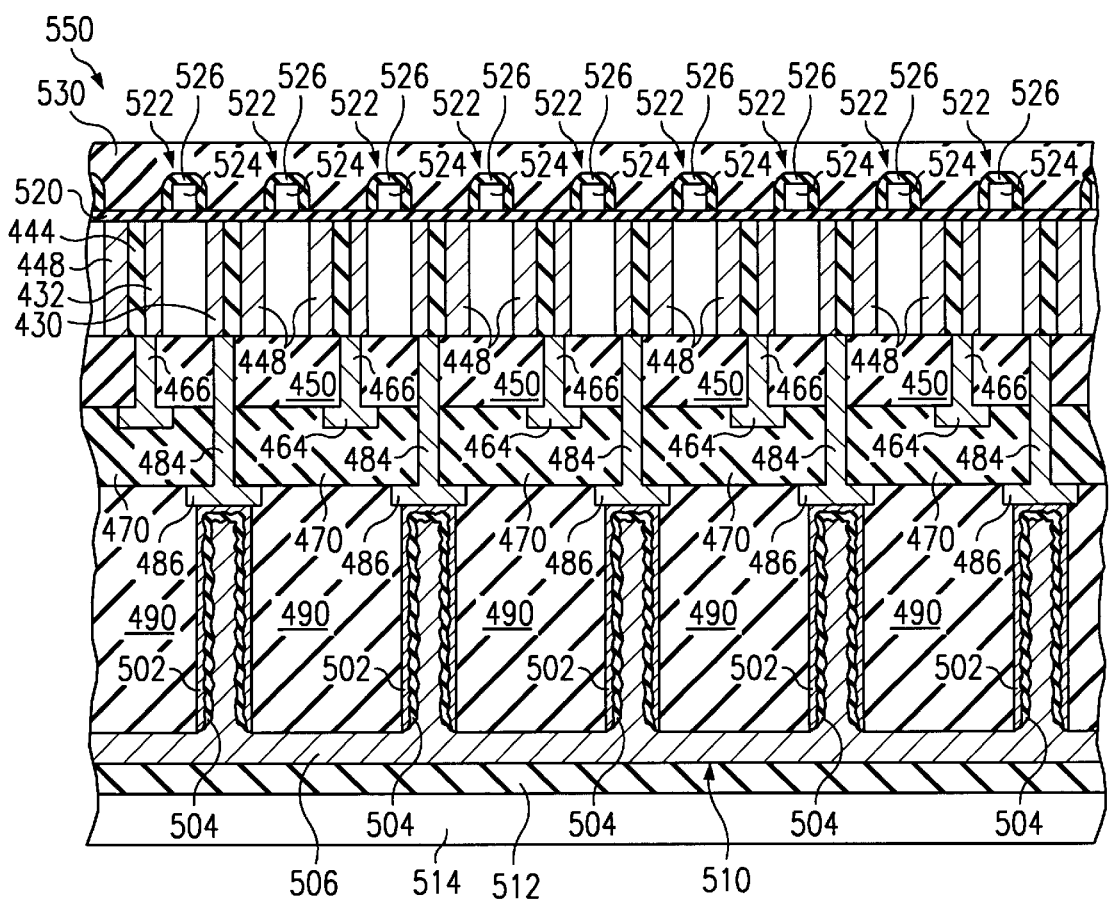
Figure 6C:
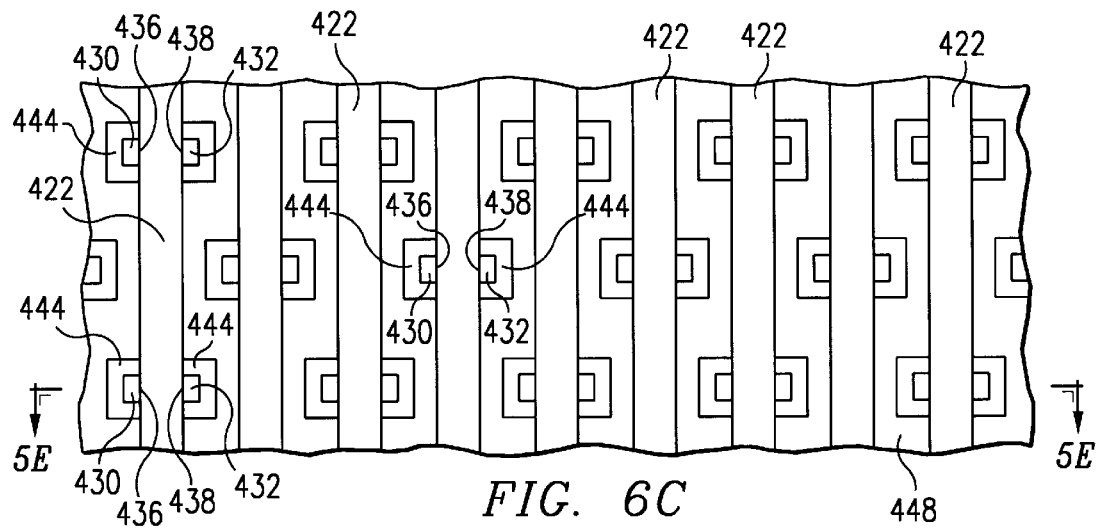

FIG. 6C is a top-plan view illustrating a bias layer 448 formed in the surrounding area 424 between the elongated projections 422 and terminal insulators 444 on the first side 414 of the substrate 412. The bias layer 448 comprises a conductive material capable of coupling the access channels 434 to a biasing system in order to reduce threshold voltage of the gate devices. For the exemplary DRAM embodiment of FIGS. 5 and 6, the bias layer 448 comprises a metal conventionally deposited and planarized to the height of the elongated projections 422.

Referring to FIG. 5E, an insulative layer 450 is formed outwardly from the elongated projections 422, the first and second terminals 430 and 432, and the terminal insulators 444. The insulative layer 450 comprises a dielectric material capable of insulating later formed bit line contacts. For the exemplary DRAM embodiment of FIGS. 5 and 6, the insulative layer comprises a conventionally deposited oxide.

Referring to FIG. 5F, a photolithographic mask 452 is conventionally formed outwardly from the insulative layer 450. The mask 452 is patterned to form bit line contact holes 454 in the insulative layer 450. As described in more detail below, bit line contacts are formed in the contact holes 454. The bit line contacts each connect a second terminal 432 of a gate device with a later formed bit line.

Portions of the insulative layer 450 exposed by the mask 452 are etched through the mask 452 to form the bit line contact holes 454. The contact holes 454 expose the second terminals 432 adjacent the elongated projections 422. The etch is a conventional anisotropic etch, other suitable etch, or other suitable series of etches capable of selectively removing the exposed material of the insulative layer 450 from the second terminals 432. After the etch process, the mask 452 is conventionally removed from the insulative layer 450.

Referring to FIG. 5G, a bit line layer 460 is formed outwardly from the insulative layer 450 and in the contact holes 454. The bit line layer 460 comprises a conductive material capable of forming bit lines. For the exemplary DRAM embodiment of FIGS. 5 and 6, the bit line layer 460 comprises a conventionally deposited metal.

Referring to FIG. 5H, a photolithographic mask 462 is conventionally formed outwardly from the bit line layer 460. The mask 462 is patterned to form a series of bit lines 464 from the bit line layer 460. As described in more detail below, the bit lines 464 each include a plurality of bit line contacts 466 coupled to the second terminals 432 of the gate devices.

Portions of the bit line layer 460 exposed by the mask 462 are etched through the mask 462 to form the bit lines 464. The etch is a conventional anisotropic etch, other suitable etch, or other suitable series of etches capable of selectively removing the exposed material of the bit line layer 460 from the insulative layer 450. After the etch process, the mask 462 is conventionally removed from the bit lines 464.

Figure 6D:
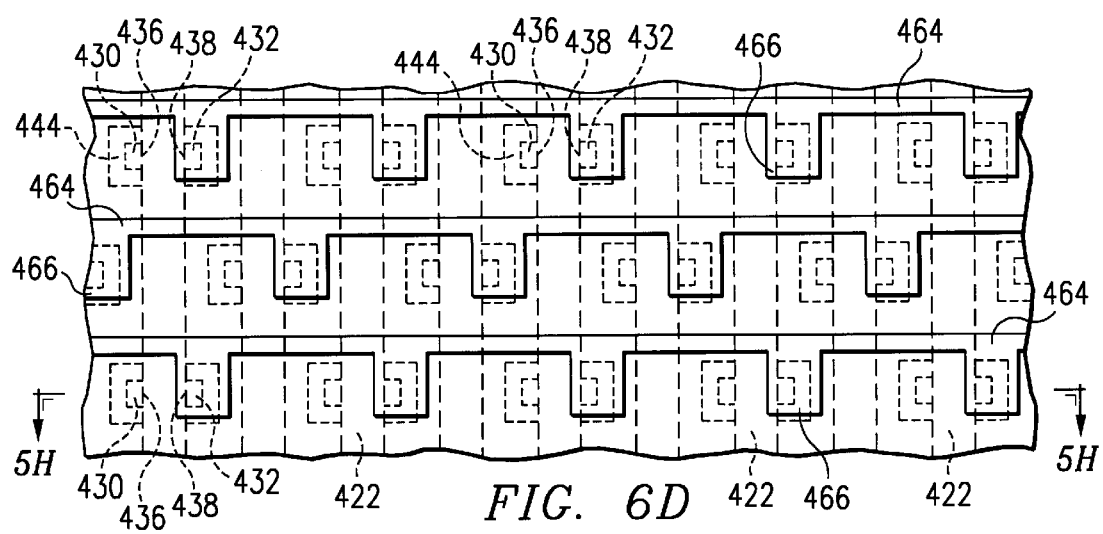

FIG. 6D is a top-plan view illustrating the bit lines 464. Referring to FIG. 6D, the bit lines 464 extend above and to the side of the terminals 430 and 432 with the bit line contacts 466 extending over and down to the second terminals 432 of the gate devices. Accordingly, the first terminals 430 of the gate devices may be later exposed and connected to storage nodes on the first side 414 of the substrate 412.

The bit lines 464 couple a plurality of memory cells to a sensing circuit for reading accessed information. The bit lines 464 may be terminated on an oxide plug at the periphery of the sub-array for easy access from the second side 416 of the substrate 412.

Referring to FIG. 5I, an insulative layer 470 is formed outwardly from the insulative layer 450 and the bit lines 464. The insulative layer 470 comprises a dielectric material capable of insulating the bit lines 464 from later formed elements of the DRAM. For the exemplary DRAM embodiment of FIGS. 5 and 6, the insulative layer 470 comprises a conventionally deposited oxide.

Referring to FIG. 5J, a photolithographic mask 472 is conventionally formed outwardly from the insulative layer 470. The mask 472 is patterned to form storage node contact holes 474 in the insulative layer 470. As described in more detail below, storage node contacts are formed in the contact holes 474. The storage node contacts each connect a first terminal 430 of a gate device with a later formed storage node for a memory cell.

Portions of the insulative layer 470 exposed by the mask 472 are etched through the mask 472 to form the storage node contact holes 474. The contact holes 474 expose the first terminals 430 of the gate devices. The etch is a conventional anisotropic etch, other suitable etch, or other suitable series of etches capable of selectively removing the exposed material of the insulative layer 470 from the first terminals 430. After the etch process, the mask 472 is conventionally removed from the insulative layer 470.

Referring to FIG. 5K, a contact layer 480 is formed outwardly from the insulative layer 470 and in the contact holes 474. The contact layer 480 comprises a conductive material capable of connecting the first terminal 430 of each gate device with a later formed storage node. For the exemplary DRAM embodiment of FIGS. 5 and 6, the contact layer 480 comprises a conventionally deposited metal.

Referring to FIG. 5L, a photolithographic mask 482 is conventionally formed outwardly from the contact layer 480. The mask 482 is patterned to form storage node contacts 484 from the contact layer 480. The storage node contacts 484 each connect to a first terminal 430 and extend through an overlying contact hole 474 to provide an enlarged contact area 486 for a later formed storage node.

Portions of the contact layer 480 exposed by the mask 482 are etched through the mask 482 to form the storage 35 node contacts 484. The etch is a conventional anisotropic etch, other suitable etch, or other suitable series of etches capable of selectively removing the exposed material of the contact layer 480 from the insulative layer 470. After the etch process, the mask 482 is conventionally removed from the contacts 484.

Referring to FIG. 5M, a storage node layer 490 is formed outwardly from the insulative layer 470 and the storage node contacts 484. As described in more detail below, the storage nodes are formed within the storage node layer 490. The storage node layer 490 comprises a dielectric material capable of insulating the later formed storage nodes from each other. The thickness of the storage node layer 490 is varied based on the desired height and thus the capacitance of the storage nodes. For the exemplary DRAM embodiment of FIGS. 5 and 6, the storage node layer 490 comprises a conventionally deposited oxide.

Referring to FIG. 5N, a photolithographic mask 492 is conventionally formed outwardly from the storage node layer 490. The mask 492 is patterned to form storage node holes 494 in the storage node layer 490. As described in more detail below, storage nodes for the memory cells are formed in the storage node holes 494. The storage nodes each store information for a memory cell.

Portions of the storage node layer 490 exposed by the mask 492 are etched through the mask 492 to form the storage node holes 494. The storage node holes 494 expose the storage node contacts 484. The etch is a conventional anisotropic etch, other suitable etch, or other suitable series of etches capable of selectively removing the exposed material of the storage node layer 490 from the storage node contacts 484. The storage node contacts 484 preferably act as an etch stop to the deep etch of the storage node layer 490. After the etch process, the mask 492 is conventionally removed from the storage node layer 490.

Referring to FIG. 5O, a storage node 500 is formed in a storage node hole 494 for each memory cell. For the exemplary DRAM embodiment of FIGS. 5 and 6, the storage node 500 is a stacked capacitor having a bottom electrode 502, a capacitor dielectric 504, and a top electrode 506. The bottom electrode 502 comprises a doped polysilicon layer conventionally deposited in the storage node holes 494. The doped polysilicon layer is conventionally ruggedized to increase the surface area between the first and second electrodes .502 and 506. The capacitor dielectric 504 comprises a nitride and oxide dielectric layer conventionally deposited outwardly from the bottom electrodes 502. The top electrode 506 is a field plate. The field plate comprises doped polysilicon deposited to fill the remaining portion of the storage node holes 294 and between the storage nodes 500. The plate material may be terminated on an oxide plug at the periphery of the sub-array for easy access from the second side 416 of the substrate 412.

Referring to FIG. 5P, the first portion 510 of the sub-array, including the first and second terminals 430 and 432, access channels 434, and storage nodes 500 for each memory cell of the sub-array, is isolated by an insulative layer 512. The insulative layer 512 comprises a dielectric material capable of insulating the first portion of the sub-array from other sub-arrays and elements of the DRAM. For the exemplary DRAM embodiment of FIGS. 5 and 6, the insulative layer 512 comprises a conventionally deposited oxide.

A support structure 514 is mounted to the insulative layer 512 on the first side 414 of the substrate 412 to provide support for the substrate 412. The support structure 514 encapsulates the first portion 510 of the sub-array to protect the bit lines 464 and the storage nodes 500. In one embodiment, the support structure 514 comprises a conductor to allow connections between the sub-arrays and to act as a heat sink for the first portion of the DRAM.

Referring to FIG. 5Q, the substrate 412 is flipped to expose the second side 416 of the substrate 412 for processing. Because of the additional support provided by the support structure 514, an excess portion of the second side 416 of the substrate 412 may be removed without damaging or unacceptably weakening the substrate 412 or DRAM.

Referring to FIG. 5R, the second side 416 of the substrate 412 is planarized to expose the first and second terminals 430 and 432 adjacent the elongated projections 422 and the access channels 434 in the elongated projections 422. The second side 416 of the substrate 412 may be conventionally planarized by a chemical mechanical polish (CMP), etch back, or other suitable process. The planarization is carefully controlled to ensure that the excess portion of the substrate 412 is removed without removing or damaging the elongated projections 422.

Referring to FIG. 5S, a gate dielectric layer 520 is formed outwardly from the first and second terminals 430 and 432 and access channels 434 on the second side 416 of the substrate 412. A series of gate structures 522 are formed outwardly from the dielectric layer 520. The gate structures 522 are each operable to control an underlying access channel 434 to selectively couple the first terminal 430 to the second terminal 432 to allow access to the storage node 500. The gate structures 522 may each be disposed over an access channel 434 between the first and second terminals 430 and 432 or otherwise suitably disposed. For example, the gate structures 522 may be disposed over the first and second terminals 430 and 432 in addition to the access channel 434.

Each gate structure 522 together with the associated access channel 434 and first and second terminals 430 and 432 form a gate device for a memory cell. For the exemplary DRAM embodiment of FIGS. 5 and 6, the gate devices are MOSFET devices and the gate structures are conventionally formed word lines comprising a gate 524 and a sidewall insulator 526. The memory cells may have a design rule as previously described in connection with the DRAM of FIGS. 1 and 2.

In operation, information in the memory cells is accessed using the word lines to couple the bit lines to the storage nodes and the bit lines to relay the stored information to the sensing circuit. The word lines and bit lines are controlled by conventional addressing logic. Additional contacts may be formed between the first and second portions of the sub-array and periphery circuit devices may be formed between the sub-arrays of the DRAM using the word line fabrication steps or other suitable processes as previously described in connection with FIGS. 1 and 2.

An insulative layer 530 is formed outwardly from the gate dielectric layer 520 and the gate structures 522 to complete the second portion 550 of the sub-array for the DRAM. The insulative layer 530 comprises a dielectric material capable of insulating and protecting the gate structures 522 from later formed elements of the DRAM. For the exemplary DRAM embodiment of FIGS. 5 and 6, the insulative layer 530 comprises a conventionally deposited oxide. Because the storage nodes 500 and the bit lines 464 are formed on the first 414, or backside, of the substrate 412, topology is minimized on the top side of the DRAM. In addition, the height of the storage nodes 500 may be increased without causing topological problems on the top side in the memory array. Storage node materials that would otherwise conflict with other components of the memory array may also be used. Accordingly, storage node capacitance is increased without increasing fabrication costs. In addition, taller and less complex storage node configurations may be used that reduce the cost and increase yield.

Although the present invention has been described with several embodiments, various changes and modifications may be suggested to one skilled in the art. It is intended that the present invention encompass such changes and modifications as fall within the scope of the appended claims.

What is claimed is:

1. A method for fabricating a memory cell, comprising:
    forming an elongated projection on a substrate, the elongated projection protruding from a surrounding area of a first side of the substrate and including an access channel for the memory cell;

forming a first terminal and a second terminal coupled to the access channel, each of the first and second terminals extending the height of the elongated projection above the substrate;

forming a storage node disposed above the first side of the substrate and coupled to the first terminal for the memory cell;

forming a bit line coupled to the second terminal for the memory cell;

removing a portion of the substrate from a second side to expose a portion of the access channel and the first and second terminals; and forming a gate structure operable to control the access channel at the exposed portion, to selectively couple the bit line to the storage node.

2. The method of claim 2, wherein the elongated projection comprises substrate material and is formed by patterning and etching the substrate.

3. The method of claim 1, wherein the first and second terminals are formed within the elongated projection.

4. The method of claim 3, wherein the first terminal is formed at a first edge of the elongated projection and the second terminal is formed at a second, opposite edge of the elongated projection.

5. The method of claim 4 wherein the first and second terminals are formed by doping portions of the first and second edges of the elongated projection.

6. The method of claim 1, wherein the first and second terminals are formed adjacent to the elongated projection.

7. The method of claim 6, wherein the first terminal is formed adjacent to a first edge of the elongated projection and the second terminal is formed adjacent to a second, opposite edge of the elongated projection.

8. The method of claim 7, wherein the terminals are formed by depositing a conductive layer adjacent to the elongated projection and removing an excess portion of the conductive layer to isolate a first remaining portion of the conductive layer as the first terminal and to isolate a second remaining portion of the conductive layer as the second terminal.

9. The method for fabricating a memory array, comprising:

forming a plurality of elongated projections on a substrate, the elongated projections each protruding from a surrounding area of a first side of the substrate and including an access channel for each of a plurality of memory cells;

forming a first terminal and a second terminal for each memory cell, the first and second terminals coupled to the access channel for the memory cell and extending the height of the elongated projection above the substrate;

forming a storage node for each memory cell, the storage node disposed above the first side of the substrate and coupled to the first terminal for the memory cell;

forming a bit line structure for each memory cell, the bit line structure coupled to the second terminal for the memory cell;

removing a portion of the substrate from a second side to expose a portion of each access channel and its associated first and second terminals; and forming a gate structure for each memory cell, the gate structure operable to control the access channel at the exposed portion to selectively couple the bit line to the storage node.

10. The method of claim 9, wherein the elongated projection comprises substrate material and is formed by patterning and etching the substrate.

11. The method of claim 9, wherein the first and second terminals are formed within the elongated projection.

12. The method of claim 11, wherein the first terminal is formed at a first edge of the elongated projection and the second terminal is formed at a second, opposite edge of the elongated projection.

13. The method of claim 12, wherein the first and second terminals are formed by doping portions of the first and second edges of the elongated projection.

14. The method of claim 9, wherein the first and second terminals are formed adjacent to the elongated projection.

15. The method of claim 14, wherein the first terminal is formed adjacent to a first edge of the elongated projection and the second terminal is formed adjacent to a second, opposite edge of the elongated projection.

16. The method of claim 15, wherein the first and second terminals for the memory cells are formed by depositing a conductive layer adjacent to the elongated projections and removing an excess portion of the conductive layer to isolate a first remaining portion of the conductive layer as the first terminals and to isolate a second remaining portion of the conductive layer as the second terminals.

* * * * *